USO09431392B2

(12) United States Patent
Rieger et al.

(10) Patent No.: US 9,431,392 B2
(45) Date of Patent: Aug. 30, 2016

(54) ELECTRONIC CIRCUIT HAVING ADJUSTABLE TRANSISTOR DEVICE

(71) Applicant: Infineon Technologies Austria AG, Villach (AT)

(72) Inventors: Walter Rieger, Arnoldstein (AT); Hans Weber, Bayerisch Gmain (DE); Michael Treu, Villach (AT); Gerhard Nöbauer, Villach (AT); Martin Pölzl, Ossiach (AT); Martin Vielemeyer, Villach (AT); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 173 days.

(21) Appl. No.: 13/837,292

(22) Filed: Mar. 15, 2013

(65) Prior Publication Data

US 2014/0264577 A1 Sep. 18, 2014

(51) Int. Cl.
| | |
|---|---|
| *H01L 29/66* | (2006.01) |
| *H01L 21/70* | (2006.01) |
| *H01L 27/06* | (2006.01) |
| *H01L 29/40* | (2006.01) |
| *H01L 29/78* | (2006.01) |
| H01L 29/06 | (2006.01) |

(52) U.S. Cl.
CPC ......... *H01L 27/0629* (2013.01); *H01L 29/407* (2013.01); *H01L 29/7803* (2013.01); *H01L 29/7813* (2013.01); *H01L 29/0634* (2013.01)

(58) Field of Classification Search
None
See application file for complete search history.

(56) References Cited

U.S. PATENT DOCUMENTS

| | | | | |
|---|---|---|---|---|
| 2004/0109334 | A1* | 6/2004 | Murakami | 363/49 |
| 2005/0062035 | A1* | 3/2005 | Bertin et al. | 257/20 |
| 2007/0138544 | A1* | 6/2007 | Hirler et al. | 257/330 |
| 2012/0049898 | A1* | 3/2012 | Mauder et al. | 327/109 |
| 2012/0305993 | A1 | 12/2012 | Willmeroth et al. | |
| 2012/0306003 | A1 | 12/2012 | Willmeroth et al. | |
| 2012/0306464 | A1 | 12/2012 | Hirler et al. | |
| 2013/0075724 | A1* | 3/2013 | Hirler et al. | 257/48 |
| 2014/0084295 | A1* | 3/2014 | Hirler et al. | 257/67 |

FOREIGN PATENT DOCUMENTS

| | | |
|---|---|---|
| CN | 102339854 A | 2/2012 |
| DE | 10211543 A1 | 10/2003 |

* cited by examiner

*Primary Examiner* — Mohammad Islam
*Assistant Examiner* — Jay C Chang
(74) *Attorney, Agent, or Firm* — Murphy, Bilak & Homiller, PLLC

(57) ABSTRACT

A transistor device includes at least one first type transistor cell including a drift region, a source region, a body region arranged between the source region and the drift region, a drain region, a gate electrode adjacent the body region and dielectrically insulated from the body region by a gate dielectric, and a field electrode adjacent the drift region and dielectrically insulated from the drift region by a field electrode dielectric. A gate terminal is coupled to the gate electrode, a source terminal is coupled to the source region, and a control terminal is configured to receive a control signal. A variable resistor is connected between the field electrode and the gate terminal or the source terminal. The variable resistor includes a variable resistance configured to be adjusted by the control signal received at the control terminal.

20 Claims, 19 Drawing Sheets

ELECTRONIC CIRCUIT HAVING ADJUSTABLE TRANSISTOR DEVICE

TECHNICAL FIELD

Embodiments of the present invention relate to a transistor device, in particular an adjustable transistor device.

BACKGROUND

MOSFETs (Metal Oxide Semiconductor Field-Effect Transistors), in particular power MOSFETs, are widely used as electronic switches for switching electrical loads or as electronic switches in all types of switching converters. A power MOSFET typically includes a drain region, a drift region adjoining the drain region, and a source region, each having a first conductivity type, and a body region arranged between the drift region and source region of a second conductivity type. A gate electrode serves to control a conducting channel in the body region between the source region and the drift region. The source region is electrically connected to a source electrode which is also connected to the body region, and the drain region is electrically connected to the drain electrode. The MOSFET can be switched on and off by applying a suitable drive potential to the gate terminal.

In a specific type of MOSFET, a field electrode is arranged in the drift region and is dielectrically insulated from the drift region by a dielectric layer. This field electrode is usually coupled to the source electrode. By virtue of the field electrode, the drift region can be more highly doped than in conventional MOSFETs, resulting in a reduced on-resistance, at a given voltage blocking capability. A reduced on-resistance results in reduced ohmic losses of the transistor device.

The field electrode, however, increases the output capacitance of the transistor device, which increases capacitive losses that may occur in operation of the transistor device.

There is, therefore, a need to provide a transistor device with a field electrode that can be optimized in terms of capacitive losses and ohmic losses.

SUMMARY

A first embodiment relates to a transistor device, including at least one first type transistor cell including a drift region, a source region, a body region arranged between the source region and the drift region, a drain region, a gate electrode adjacent the body region and dielectrically insulated from the body region by a gate dielectric, and a field electrode adjacent the drift region and dielectrically insulated from the drift region by a field electrode dielectric. A gate terminal is coupled to the gate electrode of the at least one first type transistor cell, a source terminal is coupled to the source region of the at least one first type transistor cell, and a control terminal is configured to receive a control signal. Further, a variable resistor is connected between the field electrode of the at least one first type transistor cell and one of the gate terminal and the source terminal. The variable resistor includes a variable resistance that is configured to be adjusted through the control signal received at the control terminal.

A second embodiment relates to a transistor device, including at least one first type transistor cell including a drift region, a source region, a body region arranged between the source region and the drift region, a drain region, a gate electrode adjacent the body region and dielectrically insulated from the body region by a gate dielectric, and a depletion control region adjacent the drift region. A gate terminal is coupled to the gate electrode of the at least one first type transistor cell, a source terminal is coupled to the source region of the at least one first type transistor cell, and a control terminal is configured to receive a control signal. Further, a variable resistor is connected between the field electrode of the at least one first type transistor cell and one of the gate terminal and the source terminal. The variable resistor includes a variable resistance that is configured to be adjusted through the control signal received at the control terminal. Further, a first controllable switch is connected between the gate terminal and the gate electrode of the at least one first type transistor cell and is configured to be driven dependent on the control signal.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
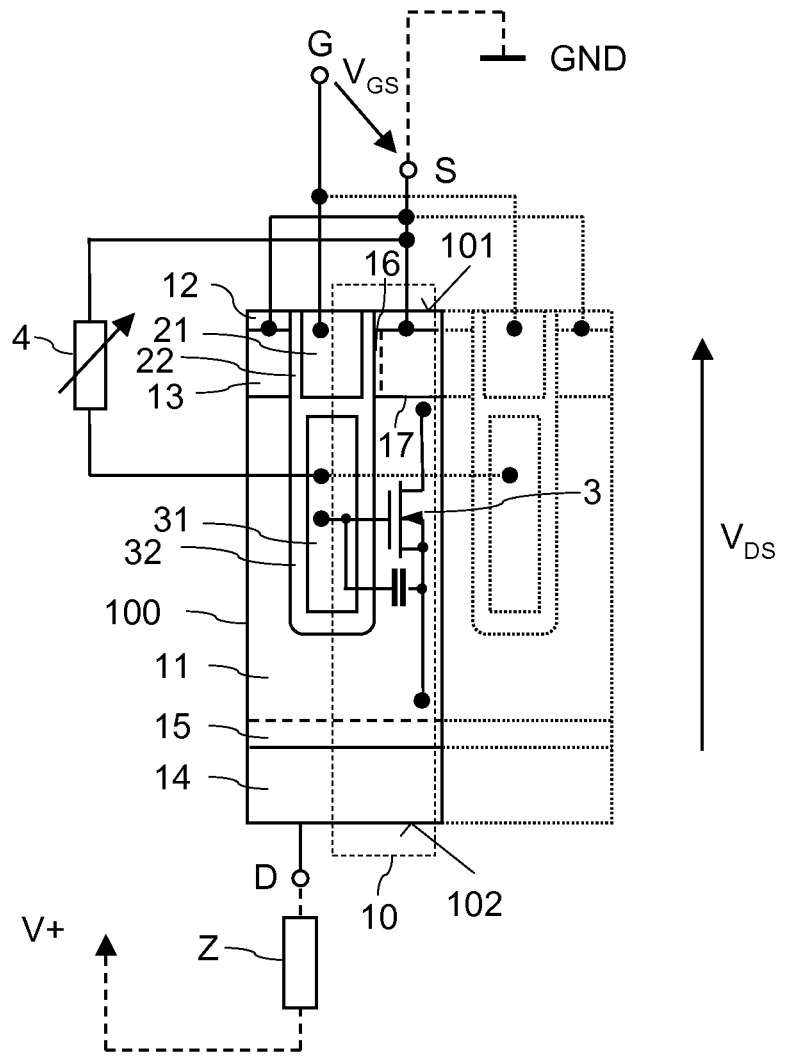
FIG. 1 illustrates a first embodiment of a transistor device including at least one transistor cell and a variable resistor.

FIG. 1 schematically illustrates a first embodiment of a transistor device, in particular a MOSFET device. The transistor device includes at least one transistor cell 10 including, in a semiconductor body 100, a drift region 11, a source region 12, a body region 13 located between the drift region 11 and the source region 12, and a drain region 14 adjacent to the drift region 11. The drain region 14 may adjoin the drift region 11 (as illustrated). According to a further embodiment, a field-stop region 15 (illustrated in dashed lines in FIG. 1) that has the same doping type as the drift region 11, but that is more highly doped than the drift region 11, is arranged between the drift region 11 and the drain region 14. Further, the transistor cell 10 includes a gate electrode 21 adjacent the body region 13 and dielectrically insulated from the body region 13 by a gate dielectric 22. In a conventional way, the gate electrode 21 serves to control a conducting channel in the body region 13 between the source region 12 and the drift region 11. Further, the transistor cell 10 includes a field electrode 31 adjacent the drift region 11 and dielectrically insulated from the drift region 11 by a field electrode dielectric 32. The function of the field electrode is explained in further detail herein below.

Referring to FIG. 1, the source region 12 and the body region 13 are both electrically connected to a source terminal S, the drain region 14 is electrically connected to a drain terminal D, and the gate electrode 21 is electrically connected to a gate terminal G. These electrical connections are only schematically illustrated in FIG. 1. According to one embodiment, the transistor device includes a plurality of transistor cells 10. These transistor cells are connected in parallel by having the source regions 12 and the body regions 13 of the individual transistor cells connected to the source terminal S, and by having the gate electrodes 21 of the individual transistor cells connected to the gate terminal G. Further, as illustrated, the individual transistor cells 10 may share the drift region 11 and the drain region 14. Further, two or more transistor cells may share one gate electrode 21 or one field electrode 31, and two or more transistor cells may share one source region 12 and one body region 13. In the embodiment of FIG. 1, two transistor cells 10 are illustrated in solid lines. In this embodiment, the two transistor cells share the gate electrode 21 and the field electrode 31 and have the drift region 11 and the drain region 14 in common (however, the transistor cell 10 illustrated in FIG. 1 could also be referred to as halfcell, and the device topology illustrated in solid lines in FIG. 1 could be considered as one transistor cell).

FIG. 1 shows a vertical cross sectional view of the semiconductor body 100 in which the device regions, namely the source region 12, the body region 13, the drift region 11 and the drain region 14, of the at least one transistor cell 10 are implemented. In the present embodiment, the transistor device is a vertical transistor device. That is, a source region 12 and a drain region 14 are located near opposite surfaces 101, 102 of the semiconductor body 100. In the present embodiment, the source region 12 is located near a first surface 101 of the semiconductor body 100, while the drain region 14 is located near an opposite second surface 102 of the semiconductor body 100. However, implementing the transistor device as a vertical transistor device, in which the source region 12 and the drain region 14 are distant in a vertical direction of the semiconductor body 100, is only an example. The basic principle disclosed herein also applies to lateral transistor devices. "Lateral transistor devices" are transistor devices in which the source and drain regions are distant in a lateral (horizontal) direction of the semiconductor body.

The semiconductor body 100 may include a conventional semiconductor material, such as silicon (Si), silicon carbide (SiC), gallium arsenide (GaAs), or the like.

The transistor device of FIG. 1 can be implemented as an n-type transistor device (n-type MOSFET), or as a p-type transistor device (p-type MOSFET). In an n-type transistor device, the source region 12, the drift region 11 and the drain region 14 are n-doped, and the body region 13 is p-doped. In a p-type transistor device, the doping types of the individual device regions are complementary to the doping types in an n-type transistor device. That is, the source region 12, the drift region 11 and the drain region 14 are p-doped, and the body region 13 is n-doped. Further, the transistor device can be implemented as an enhancement (normally off) transistor device, or as a depletion (normally on) transistor device. In an enhancement transistor device, the body region 13, that has a doping type opposite to the doping types of the source region 12 and the drift region 11, adjoins the gate dielectric 22, so that the transistor device is only in an on-state when the gate electrode 21 generates an inversion channel in the body region 13 between the source region 12 and the drift region 11. In a depletion transistor device 3, there is a channel region 16 (illustrated in dashed lines in FIG. 1) of the same doping type as the source and drift regions 12, 12 along the gate dielectric 22 between the source region 12 and the drift region 11. In this embodiment, the transistor device is blocking (is switched off) when the gate electrode 21 generates a depletion region in a channel region 16.

For explanation purposes, in particular for explaining the operating principle of the transistor device of FIG. 1, it is assumed that the transistor device is an n-type enhancement transistor device (MOSFET). However, this operating principle also applies to a p-type MOSFET or a depletion MOSFET 3. In case of a p-type MOSFET, polarities of the voltages explained in the following have to be inverted. For explanation purposes, it is further assumed that the drain-source path of the transistor device is connected in series with a load Z, and that the series circuit with the load Z and the transistor device is connected between terminals for a positive supply potential V+ and a negative supply potential, or a reference potential, such as ground, respectively. At first, the basic operating principle of the transistor device is described, wherein it is assumed that the variable resistor has a zero resistance.

The transistor device is in an on-state (switched on) when a voltage between the drain terminal D and the source terminal S (drain-source voltage) is positive and when a drive voltage (gate-source voltage) is applied between the gate terminal G and the source terminal S that generates an inversion channel in the body region 13 between the source region 12 and the drift region 11. In an n-type transistor device, the gate-source voltage $V_{GS}$ that switches on the transistor device, is a positive voltage higher than a threshold voltage $V_{th}$. The threshold voltage $V_{th}$ is, for example, between 0.5V and 5V. In the on-state, an electron current flows from the source region 12 through the channel in the body region 13, the drift region 11 and the drain region 14 to the drain terminal D.

The transistor device switches off when the conducting channel in the body region 13 is interrupted. When, for example, a threshold voltage of the transistor device is a positive voltage, the transistor device can be switched off by setting the gate-source voltage $V_{GS}$ to zero, in other words by applying the source potential to the gate terminal G. When the conducting channel in the body region 13 is interrupted, and when there is still a positive voltage between the drain terminal D and the source terminal S, a pn junction 17 between the drift region 11 and the body region 13 is reverse biased, so that a space charge region (depletion region) expands in the drift region 11 beginning at the pn-junction 17. As the depletion region expands in the drift region 11, a voltage level of the drain-source voltage $V_{DS}$ increases. A width of the depletion region, which is a dimension of the depletion region in a direction perpendicular to the pn-junction 17, is dependent on the drain-source voltage $V_{DS}$ that reverse biases the pn-junction 17, wherein the width of the depletion region increases as the drain-source voltage $V_{DS}$ increases.

Within the depletion region there are ionized dopant atoms in the drift region 11. These ionized dopant atoms have a positive charge when the drift region 11 is n-doped (and have a negative charge when the drift region 11 is p-doped). Negative charges corresponding to the positive charges in the drift region 11 are located in the body region 13 on the other side of the pn-junction 17. In general, the voltage blocking capability of the transistor device is reached when the electrical field generated by ionized dopant atoms in the drift region 11 and corresponding counter charges in the body region 13 reaches the critical electrical field. The critical electrical field is a material constant of the semiconductor material of the semiconductor body 100. The reverse biasing voltage at which the critical electrical field is reached at the pn-junction 17 is dependent on the doping concentration of the drift region 11 and is, therefore, dependent on the number of dopant atoms that can be ionized when a reverse biasing voltage is applied to the pn-junction 17.

Figure 2:
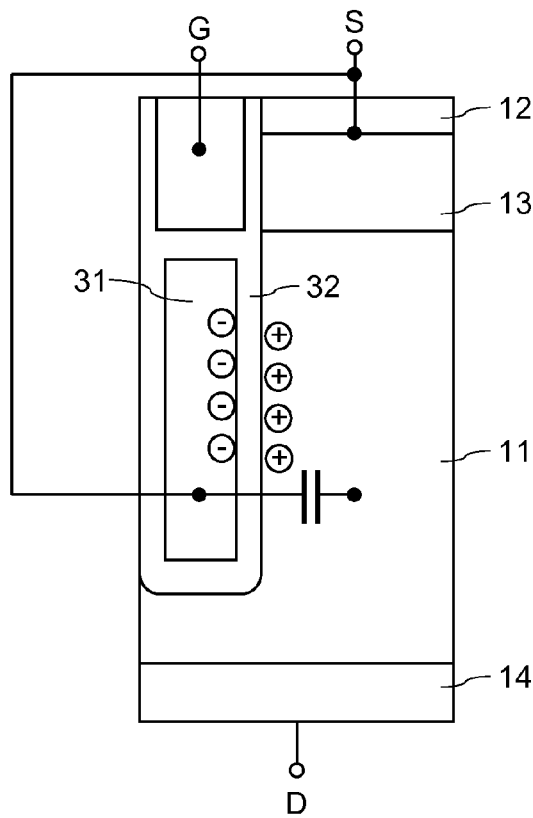
FIG. 2 shows a detail of FIG. 1 illustrating the operating principle of the transistor device.

In the transistor device of FIG. 1, ionized dopant atoms in the drift region 11 not only find corresponding counter charges in the body region 13, but also find corresponding counter charges in the field electrode 31. Field electrode 31 has an electrical potential corresponding to the source potential that is more negative than an electrical potential of the drift region 11 surrounding the field electrode 31 in the off-state of the transistor device. Thus, in an n-type transistor device, in the off-state, the field electrode 31 is negatively charged relative to the surrounding drift region 11. That is, electrons accumulate in the field electrode 31 along the field electrode dielectric 32, wherein these electrodes provide counter charges for ionized (positively charged) dopant atoms in the drift region 11. This is schematically illustrated in FIG. 2.

By virtue of the field electrode 31 providing counter charges to ionized dopant atoms in the drift region 11, the drift region 11 of the transistor device of FIG. 1 can be more highly doped than the drift region of a conventional transistor device that does not include a field electrode, without decreasing the voltage blocking capability of the transistor device. Thus, at a given voltage blocking capability, the transistor device with field electrode 31 has a lower on-resistance ($R_{DS,on}$). The doping concentration of the source and drain regions 12, 14 is, for example, between $1E19$ cm$^{-3}$ and $1E21$ cm$^{-3}$, the doping concentration of the body region 13 is, for example, between $1E16$ cm$^{-3}$ and $1E18$ cm$^{-3}$, and the doping concentration of the drift region 11 is, for example, between $1E14$ cm$^{-3}$ and $1E17$ cm$^{-3}$.

The field electrode 31, the field electrode dielectric 32, and those regions of the drift region 11 adjoining the field electrode dielectric 32 form a depletion MOSFET 3 that includes the field electrode 31 as a gate electrode, the field electrode dielectric 32 as a gate dielectric, and the drift region 11 as the source, body and drain region. The circuit symbol of this depletion MOSFET is illustrated in FIG. 1. In an n-type transistor device, this depletion MOSFET 3 is an n-type depletion MOSFET 3. This depletion MOSFET 3 starts to pinch off when an electrical potential of the field electrode 31 is negative relative to the electrical potential of the drift region 11. This occurs, when the pn-junction 17 is reverse biased and the electrical potential of the drift region 11 increases.

Figure 3:
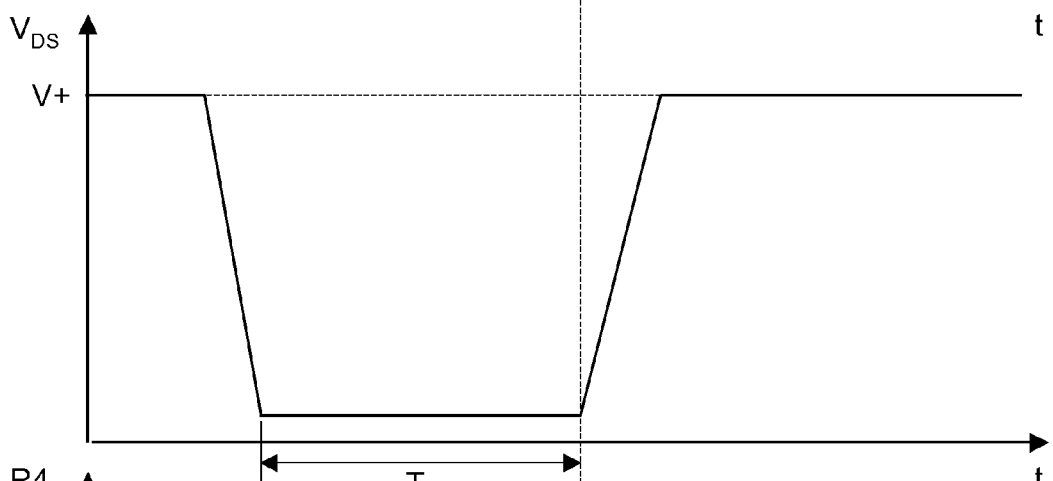
FIG. 3 shows timing diagrams illustrating the operating principle of the transistor device of FIG. 3.

FIG. 3 shows exemplary timing diagrams of the gate-source $V_{GS}$, and the drain-source voltage $V_{DS}$ in order to illustrate the operating principle of the transistor device of FIG. 1. FIG. 3 shows one switching cycle in which the transistor device is switched on for an on-period $T_{ON}$, and is switched off after the on-period $T_{ON}$. During the on-period $T_{ON}$, the drain voltage $V_{DS}$ is relatively low as compared with the voltage across the load Z, and is dependent on the on-resistance $R_{DS,on}$, and the current through the load. Typically, in a transistor device with a voltage blocking capability between 100V and 600V, the drain-source voltage $V_{DS}$, in the on-state, is several volts at most. When the transistor device switches off, the drain-source voltage increases until substantially the complete supply voltage (which is V+ in the present embodiment) drops across the transistor device. A rate at which the drain-source voltage increases after the gate-source voltage $V_{GS}$ falls below the threshold voltage $V_{th}$ can be adjusted by adjusting the resistance of the variable resistor.

For explanation purposes it is assumed that the variable resistor 4 can have at least two different resistance levels, specifically a low level R4$_L$, and a higher level R4$_H$. Ways to adjust this resistance level of the variable resistor are explained herein further below. It is further assumed that the variable resistor 4 has the low resistance level when the transistor device switches off. This low level allows the field electrode 31 to be (negatively) charged, so that the field electrode 31 contributes to the compensation of charge carriers when the transistor device is in the off-state. For explanation purposes it is further assumed that the resistance level changes to the high level when the transistor device has been switched off, and stays on the high level when the transistor device switches on again. The high resistance level at the time of switching on slows down the discharging of the field electrode 31, so that the transistor device switches from the off-state to the on-state slower than in a scenario in which the variable resistor 4 has the low resistance level at the time of switching on. In other words, a relatively high resistance level of the variable resistor 4 results in slow switching process with a relatively smooth switching edge of the drain-source voltage V$_{DS}$. This is because the depletion region in the drift region 11 along the field electrode dielectric 32 dissipates relatively slowly, so that the on-resistance is relatively high at the beginning of the on-state. However, the field electrode 31 is finally discharged, resulting in a low on-resistance of the transistor device. At this time, or even before, the resistance level can be reduced to the low level until the transistor device again switches on. A timing diagram of the resistance level is schematically illustrated in FIG. 3.

Figure 4:
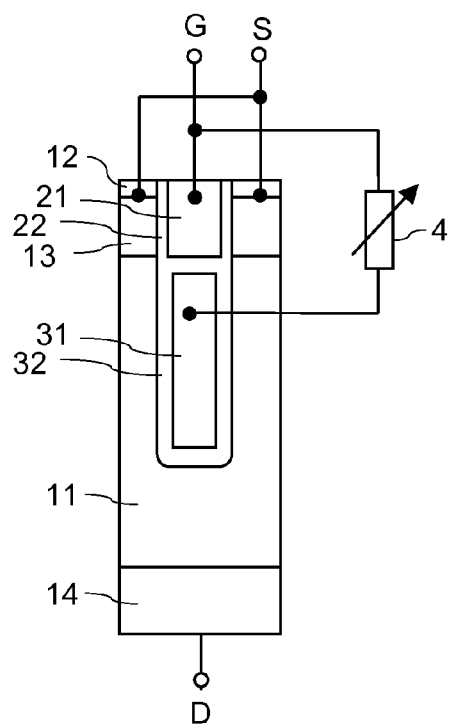
FIG. 4 illustrates a second embodiment of a transistor device including at least one transistor cell and a variable resistor.

According to one embodiment that is illustrated in FIG. 4, the field electrode 31 is coupled to the gate terminal G instead of the source terminal S. In the off-state, when the gate potential (the electrical potential at the gate terminal G) corresponds to the source potential (the electrical potential at the source terminal S), the transistor device of FIG. 3 operates like the transistor device of FIG. 1. In the on-state, the field electrode 31 has gate potential, which is higher than the electrical potentials at the source- and drain terminals S, D, so that in the on-state the field electrode 31 may induce an accumulation channel along the field electrode dielectric 32 in the drift region 11. This accumulation channel helps to further decrease the on-resistance of the transistor device. For example, the transistor device is implemented with the voltage blocking capability of between 100V and 600V or more. The gate-source voltage that switches on the transistor device is, for example, between 7V and 15V, while a voltage between the drain terminal D and the source terminal S in the on-state is usually below 3V in this type of transistor device.

Figure 5:
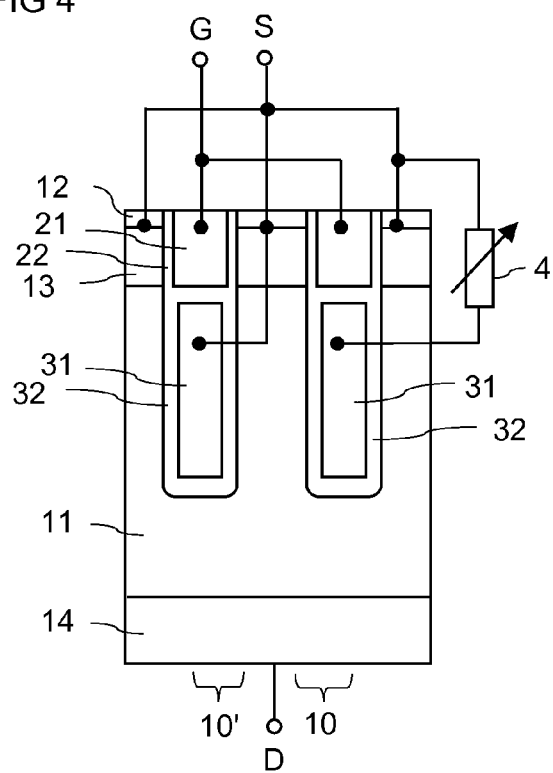
FIG. 5 illustrates a third embodiment of a transistor device including at least one transistor cell and a variable resistor.

According to one embodiment, that is illustrated in FIG. 5, the transistor device includes at least one transistor cell 10 that has the field electrode 31 coupled to the source terminal S (as illustrated) or the gate terminal G (not illustrated) through the variable resistor 4, and that includes at least one further transistor cell 10' that has the field electrode 31 directly connected to the source terminal S (as illustrated) or to the gate terminal G (not illustrated), that is through an electrical conductor. This conductor may include an electrical conducting material, such as a metal, or a highly doped polycrystalline semiconductor material. Inevitably, this electrical conductor has a resistance. This resistance may vary dependent on a temperature, but this resistance cannot be varied by applying a drive signal in the same way as the resistance of the variable resistor can be varied. The transistor cell 10 will be referred to as variable transistor cell (first type transistor cell) in the following, and the transistor cell 10' will be referred to as conventional transistor cell (second type transistor cell) in the following.

The individual transistor cells 10, 10' in the transistor device of FIG. 4 are connected in parallel. In other words, the individual transistor cells have their source and body regions 12, 13 connected to the source terminal S and have their gate electrodes 21 connected to the gate terminal. Further, the individual transistor cells 10, 10' have the drift region 11 and the drain region 14 in common. In the transistor device of FIG. 5 the at least one transistor cell with the variable resistor 4 can be deactivated by adjusting the resistance level such that the field electrode 31 cannot be discharged after the transistor device has been switched off for the first time. When the field electrode 31 cannot be discharged, the depletion region in the drift region 11 along the field electrode dielectric 32 cannot dissipate, so that a conducting channel in the drift region 11 of the transistor cell is permanently interrupted, or so that the transistor cell 10 operates with a high on-resistance.

Figure 6:
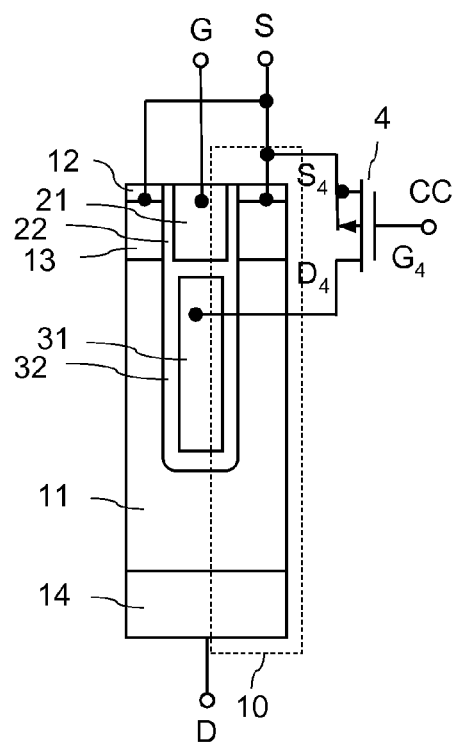
FIG. 6 illustrates one embodiment of a transistor device including at least one transistor cell and a variable resistor implemented as a depletion MOSFET.

According to one embodiment illustrated in FIG. 6, the variable resistor 4 includes a depletion MOSFET with a load path (drain-source path) and a gate terminal G$_4$. The load path is connected between the field electrode 31 and one of the source terminal S (as illustrated), and the gate terminal (not illustrated). The gate terminal G$_4$ is connected to a control terminal or forms a control terminal CC of the transistor device. The control terminal CC is configured to receive a drive signal, wherein this drive signal is configured to adjust an on-resistance of the depletion MOSFET 4, which is an electrical resistance between the drain and source terminals D$_4$, S$_4$ of the depletion MOSFET. According to one embodiment, the depletion MOSFET 4 is a p-type depletion MOSFET when the transistor device is an n-type transistor device. Referring to FIG. 6, the source terminal S$_4$ of the depletion MOSFET 4 can be connected to the source terminal S of the transistor device, and the drain terminal D$_4$ of the depletion MOSFET 4 can be connected to the field electrode 31.

Figure 7:
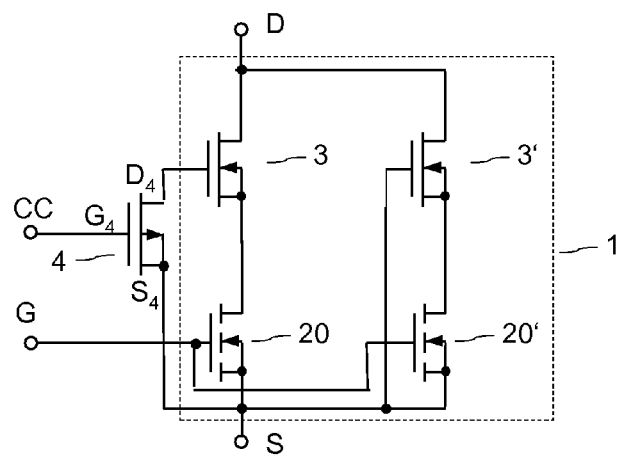
FIG. 7 illustrates the equivalent circuit diagram of the transistor device of FIG. 6.

FIG. 7 illustrates the equivalent circuit diagram of the transistor device of FIG. 6. The equivalent circuit diagram includes a series circuit with a first MOSFET 20 and a second MOSFET 3 connected between the source and drain terminals of the transistor device. This series circuit represents the at least one transistor cell 10 of FIG. 6, wherein the first MOSFET 20, which is an n-type enhancement MOSFET in the present embodiment, is formed by the gate electrode 21, the gate dielectric 22, the source and body regions 12, 13 and a section of the drift region 11. The second MOSFET 3, which is an n-type depletion MOSFET in the present embodiment, is formed by another section of the drift region 11 and the drain region 14, the field electrode 31 and the field electrode dielectric 32 of the at least one transistor cell 10. The series circuit with the first and second MOSFET 20, 3 formed by the at least one transistor cell will be referred to as load MOSFET 1 in the following. Referring to FIG. 7, the equivalent circuit diagram further includes a further depletion MOSFET, which is the p-type depletion MOSFET 4 explained with reference to FIG. 6. This depletion MOSFET 4 that controls charging and discharging of the field electrode of the load MOSFET 1 will be referred to as control MOSFET 4 in the following. The control MOSFET 4 has its drain-source path connected between the gate terminal of the second MOSFET 3 and the source terminal S of the transistor device. The gate terminal G$_4$ of the control MOSFET is coupled to the control terminal CC.

The transistor device of FIG. 7 can be operated like a conventional transistor device (a conventional MOSFET) by applying a drain-source voltage between the drain and source terminal D, S and by applying a suitable drive voltage between the gate terminal G and the source terminal S. Further, the process of charging and discharging the field electrode 31 of the at least one transistor cell 10 forming the load MOSFET 1 can be controlled by controlling the electrical potential at the control terminal CC.

It should be noted that the load transistor 1, additionally to the at least one variable transistor cell 10, may include at least one conventional transistor cell 10'. This at least one conventional transistor cell is represented by series circuit with a third MOSFET 20' and a fourth MOSFET 3'. This series circuit is different from the series circuit with the first MOSFET 20 and the second MOSFET 3 in that a gate node of the fourth MOSFET 3' is coupled to the source terminal S (as illustrated) or the gate terminal G (as not illustrated) of the transistor device.

In the following discussion, several embodiments of the transistor device are explained with reference to drawings. In these drawings, only variable transistor cells 10 of the load MOSFET 1 are shown. However, the load MOSFET may also include at least one conventional transistor cell 10', that is, the load MOSFET 1 may include at least one transistor cell 10' that has the field electrode 31 not connected to the control MOSFET 4.

Figure 8:
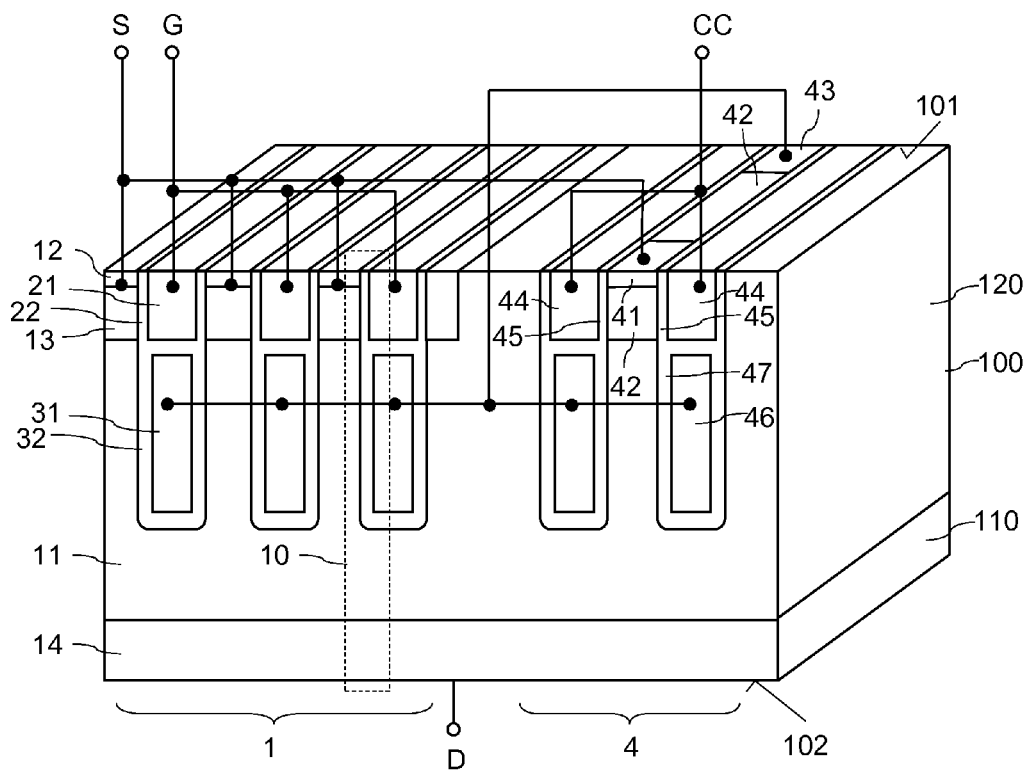
FIG. 8 illustrates one embodiment of a transistor device including a plurality of vertical transistor cells and a variable resistor implemented as lateral depletion MOSFET.

FIG. 8 schematically shows a perspective sectional view of a semiconductor body 100 in which several transistor cells of the load MOSFET 1 and the control MOSFET 4 are implemented. The individual transistor cells 10 of the load MOSFET 1 are implemented as explained with reference to FIG. 1 herein before. These transistor cells are longitudinal transistor cells in the present embodiment. That is, the source and body regions 12, 13, the gate electrode 21 and the gate dielectric 22, the field electrode 31 and the field electrode dielectric 32 are elongated regions each extending in the horizontal direction of the semiconductor body 100. The load MOSFET 1 is a vertical MOSFET, meaning that the source region 12 is located near the first surface 101 of the semiconductor body, and the drain region 14 is located near the second surface 102 of the semiconductor body 100.

Referring to FIG. 8, the control MOSFET 4 is a lateral MOSFET that includes a source region 41, a body region 42 and a drain region 43. The source region 41 and the drain region 43 are distant in a lateral direction of the semiconductor body, and the body region 42 is located between the source region 41 and the drain region 43. The source region 41, the body region 42 and the drain region 43 have the same doping type, which is p-type when the load MOSFET 1 is an n-type MOSFET. The doping concentrations of the source and drain regions 41, 43 are, for example between $1E18$ $cm^{-3}$ and $1E21$ $cm^{-3}$, and the doping concentration of the body region 42 is, for example, between $1E15$ $cm^{-3}$ and $1E17$ $cm^{-3}$.

Referring to FIG. 8, the control MOSFET 4 further includes at least one gate electrode 44 that is dielectrically insulated from the source region 41, the body region 42 and the drain region 43 and that extends from the source region 41 to the drain region 43 in the lateral direction of the semiconductor body 100. In the embodiment of FIG. 8, the control MOSFET 4 includes two opposite gate electrodes 44, so that the source region 41, the body region 42 and the drain region 43 are arranged between the two opposite gate electrodes 44. However, this is only an example. According to a further embodiment (not illustrated), one of the two gate electrodes 44 and the corresponding gate dielectric 45 is replaced with an insulating material, such as an oxide, and an optional further (floating) electrode.

The at least one gate electrode 44 is electrically connected to the control terminal CC, the drain region 43 is electrically connected to the field electrodes 31 of the load MOSFET 1, and the source region 41 is electrically connected to the source regions 12 of the transistor cells 10 of the load MOSFET 1, and the source terminal S, respectively. In the vertical load MOSFET 1 of FIG. 8, the field electrode 31 is buried in the semiconductor body 100. One way to electrically connect the buried field electrode 31 to the drain region 43 of the control MOSFET 4 is explained with reference to FIG. 9 herein further below.

In the embodiments explained before, the field electrode 31 of one transistor cell 10 is located below the gate electrode 21 of the transistor cell in one common trench. However, this is only an example. The basic principle disclosed herein is not restricted to a load MOSFET having the field electrode 31 in the same trench as the gate electrode 21. It is also possible to implement the load MOSFET 1 such that the field electrode 31 and the gate electrode 21 of one transistor cell are located in separate trenches.

Referring to FIG. 8, the transistor cells of the load MOSFET 1 and the control MOSFET 4 have similar gate structures. That is, the control MOSFET, like the load MOSFET 1, includes a field electrode 46 below the at least one gate electrode 44. This field electrode 46 may be connected to the field electrodes 31 of the transistor cell, or may be connected to another defined electrical potential, such as source potential, or gate potential of the transistor cells 10, or to the control terminal CC. Implementing the load MOSFET 1 and the control MOSFET 4 with similar gate structures is beneficial in terms of economically producing the transistor device. The gate electrode 21 and the field electrode 31 and the corresponding dielectrics 22, 32 of the load MOSFET 1 and the gate electrode 44, with the corresponding gate dielectric 45 of the control MOSFET 4 can be produced using the same method steps.

The control MOSFET 4 of FIG. 8 acts like a variable resistor, wherein the electrical resistance between the source region 41 and the drain region 43 can be controlled by the electrical potential applied to the control terminal CC. When, in type of a p-type control MOSFET 4, this electrical control potential is higher than the source potential, a depletion region is generated in the body region 42 along the gate dielectric 45, wherein the electrical resistance of the body region 42 between the source region 41 and the drain region 43 increases, as the depletion region expands further. The depletion region expands further as the level of the electrical potential at the control terminal CC relative to the electrical potential at the source terminal S increases.

Figure 9:
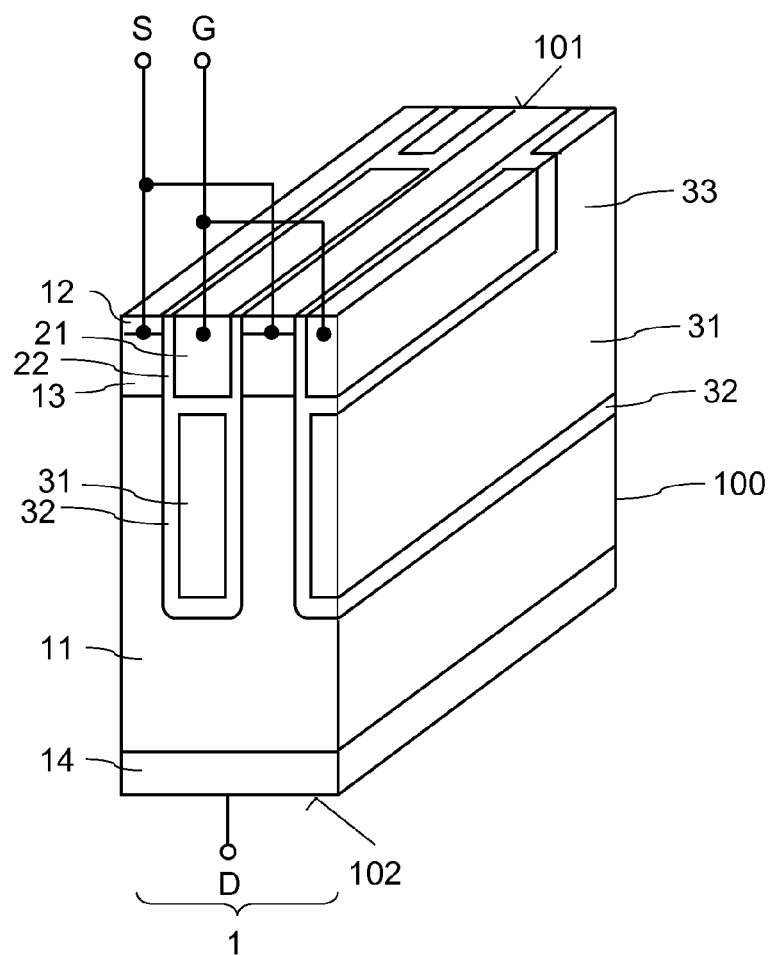
FIG. 9 shows one embodiment of the transistor cells of FIG. 8 in detail.

FIG. 9 shows one embodiment of the load MOSFET 1 in which the field electrodes 31 of the transistor cells of the load MOSFET 1 can be easily connected to the drain region 43 of the control MOSFET 4 (the control MOSFET 4 is not illustrated in FIG. 9). In this embodiment, the field electrode 31 extends further in the lateral direction than the gate electrode 21, and includes a field electrode section 33 that is dielectrically insulated from the gate electrode 21 and that extends to the first surface 101 of the semiconductor body. The section 33 that extends to the first surface 101 can be electrically connected to the drain region 43 of the control MOSFET 4 using, for example, a conventional semiconductor wiring technology.

Figure 10:
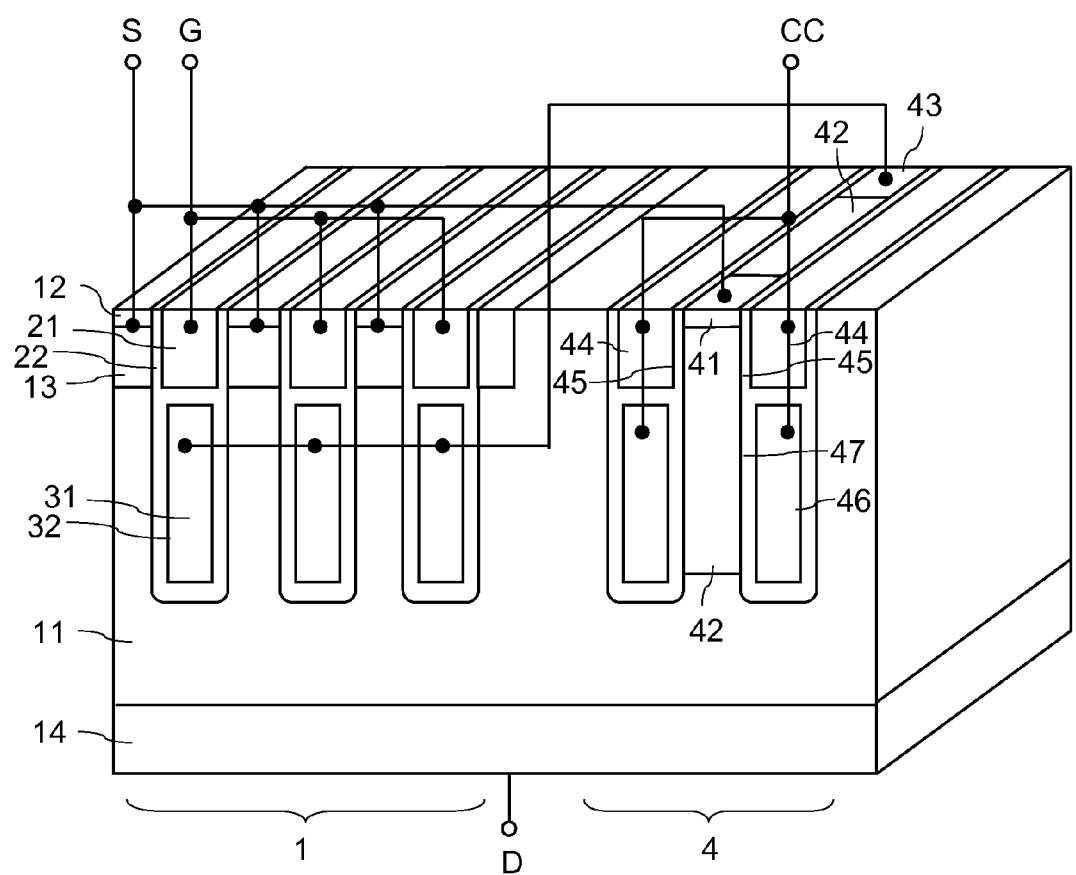
FIG. 10 shows a modification of the transistor device of FIG. 9.

Referring to FIG. 8, the semiconductor body 100 may include two semiconductor layers, namely a first semiconductor layer 110 forming the drain region 14, and a second semiconductor layer 120. The first semiconductor layer 110 can be a semiconductor substrate, in particular a highly doped semiconductor substrate having the doping concentration of the drain region 14. The second semiconductor layer 11 can be an epitaxial layer and may have a basic doping corresponding to the doping concentration of the drift region 11. The source and body regions 12, 13 of the load MOSFET 1, as well as the source, body and drain regions 41-43 of the control MOSFET 4 can be produced by implantation and/or diffusion techniques in the second semiconductor layer 120. In the embodiment of FIG. 8, a semiconductor region having a doping concentration corresponding to the doping concentration of the drift region 11 is arranged between the field electrodes 46 of the control MOSFET 4. According to a further embodiment, illustrated in FIG. 10, the body region 42 in the vertical direction of the semiconductor body 100 extends beyond the gate electrode 44 and is also adjacent the field electrode 46 (and dielectrically insulated from the field electrode 46 by the dielectric layer 47 insulating the field electrode 46 from the semiconductor body 100). In the embodiment of FIG. 10, the body region 42 of the control MOSFET 4 has a larger cross-section area than in the embodiment of FIG. 8, so that the control MOSFET 4 of FIG. 10 has a lower minimum on-resistance. The field electrode 46 may be connected to the gate electrode 44, that is to the control terminal CC.

In the embodiments explained previously, the variable resistor 4 slows down the charging and discharging of the field electrode 31 when the resistance is low enough to allow a current to flow between the one of the gate and source terminals and the field electrode 31, but does not prevent the field electrode 31 from being completely charged or discharged. However, it is also possible to operate the variable resistor 4 like a switch that either allows a current flow (on-state) or prevents a current flow (off-state). According to a further embodiment, illustrated in FIG. 11, a switch 5 is connected in series with the variable resistor 4. This is useful in particular when the variable resistor 4 is operated to slow down charging and discharging the field electrode 31, but does not prevent a current flow.

Figure 11:
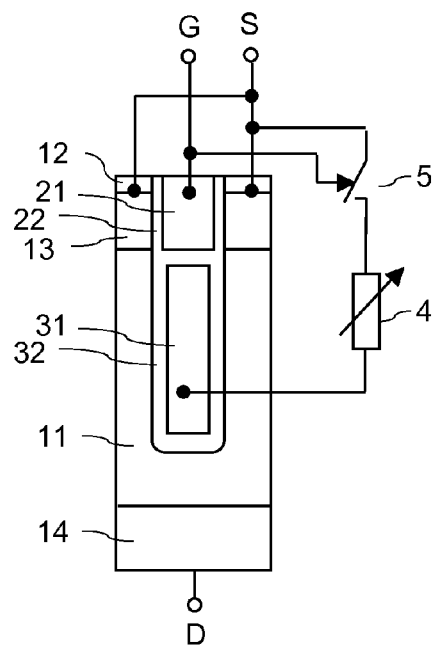
FIG. 11 illustrates one embodiment of a transistor device including at least one transistor cell, a variable resistor, and a switch connected in series with the variable resistor.

Referring to FIG. 11, the series circuit with the variable resistor 4 and the switch 5 is connected between the field electrode 31 and one of the source terminal S (as illustrated in FIG. 10), and the gate terminal G (as not illustrated in FIG. 10) of the transistor device. In the embodiment of FIG. 11, the variable resistor 4 is directly connected to the field electrode 31, so that the switch 5 is connected between the variable resistor 4 and the one of the source terminal S and the gate terminal G. However, this order could be changed so that the switch 5 is directly connected to the field electrode 31, and the variable resistor 4 is connected between the switch 5 and the one of the source terminal S and the gate terminal G.

According to one embodiment, the switch 5 has a control node coupled to the gate terminal G of the transistor device, so that the transistor device and the switch 5 are controlled by the same drive potential applied to the gate terminal G of the transistor device.

This switch 5 can be an electronic switch, in particular a MOSFET. In those embodiments in which both the variable resistor 4 and the switch 5 are implemented as MOSFETs, the control MOSFET 4 will be referred to as first control MOSFET 4, and the switch MOSFET 5 will be referred to as second control MOSFET 5. The second control MOSFET 5 may be a depletion MOSFET of a conduction type complementary to the conduction type of the transistor device. That is, the switch 5 is a p-type depletion MOSFET, when the transistor device is an n-type transistor device.

Figure 12:
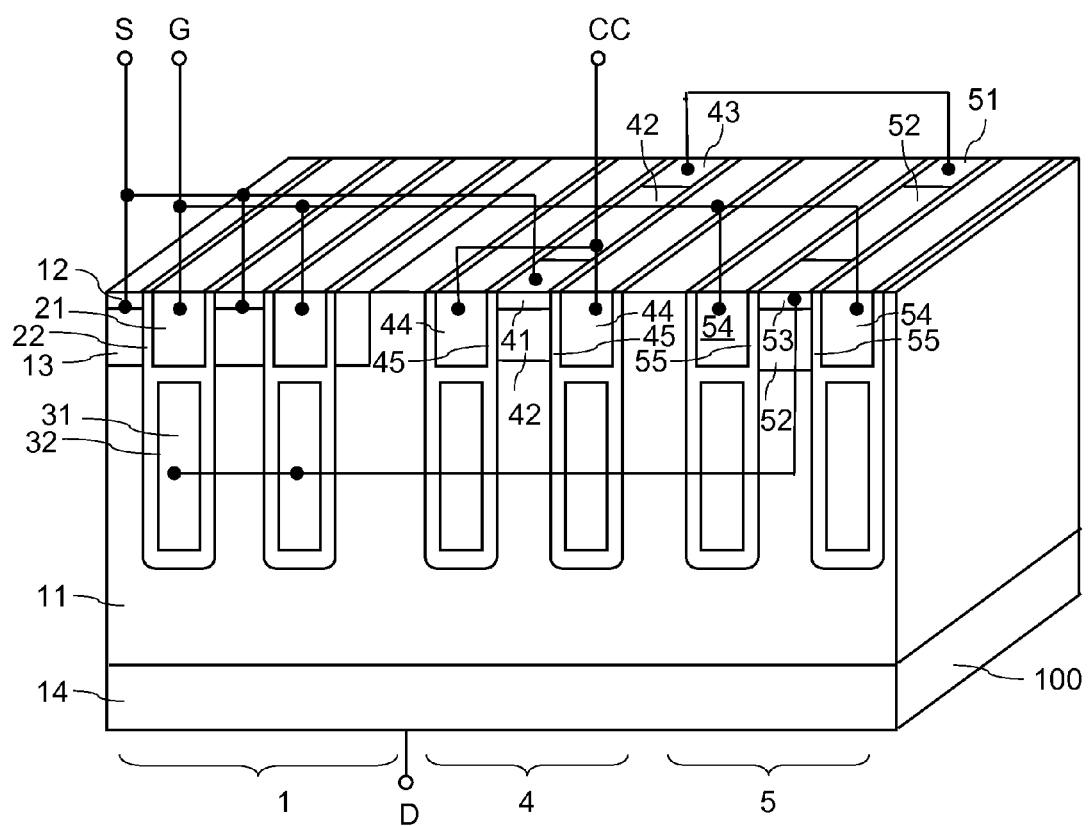
FIG. 12 illustrates one embodiment of a transistor device including a plurality of vertical transistor cells, a variable resistor implemented as lateral depletion MOSFET, and the switch implemented as a lateral depletion MOSFET.

FIG. 12 shows a perspective sectional view of a semiconductor body 100 in which device region of the load MOSFET 1 and in which device regions of the first and second control MOSFETs 4, 5 are implemented. In this embodiment, the first control MOSFET 4 is a lateral MOSFET of the type explained with reference to FIG. 8 or 10 herein before. The second control MOSFET 5 is also implemented as a lateral MOSFET. In the present embodiment, the switch second control MOSFET 5 has a device topology corresponding to the device topology of the first control MOSFET 4. Specifically, the second control MOSFET 5 includes a source region 51, a body region 52 and a drain region 53, wherein the source and body regions 51, 53 are distant in a lateral direction of the semiconductor body and are separated by the body region 52. The source region 51, the body region 52 and the drain region 53 have the same doping type, which is a p-type, in embodiments wherein the second control MOSFET 5 is a p-type depletion MOSFET. At least one gate electrode 54 is adjacent the source region 51, the body region 52 and the drain region 53, and is dielectrically insulated from these device regions 51-53 by a gate dielectric 55. The second control MOSFET 5 may include two opposite gate electrodes 54 (as illustrated), or may include only one gate electrode 54. In the latter case, one of the gate electrodes 54 of FIG. 12 may be replaced by a dielectric region such as an oxide and an optional further electrode.

Referring to FIG. 12, the drain region 53 of the switch 5 is electrically connected to the field electrodes 31 of the transistor cells of the load MOSFET 1, the source region 51 of the second control MOSFET 5 is connected to the drain region 43 of the control MOSFET 4, and the source region 41 of the first control MOSFET 4 is connected to the source terminal S. However, it is also possible to change the order of the first control MOSFET 4 and the second control MOSFET 5 between the field electrodes 31 and the source terminal S, that is the drain 43 of the first control MOSFET 4 could be connected to the field electrodes 31 and the source regions 51 of second control MOSFET 5 could be connected to the source terminal S.

Figure 13:
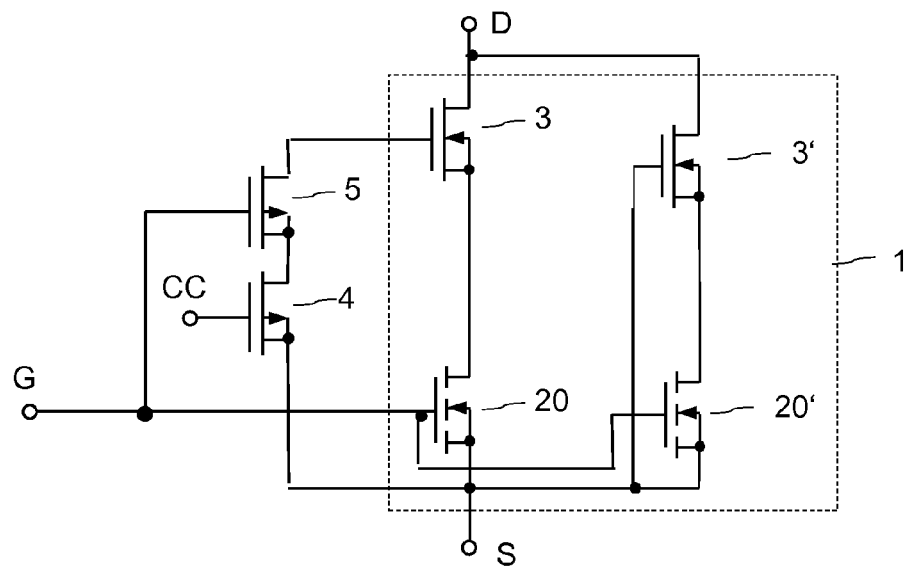
FIG. 13 illustrates the equivalent circuit diagram of the transistor device of FIG. 12.

FIG. 13 shows the equivalent circuit diagram of the semiconductor device of FIG. 11. This circuit diagram is based on the circuit diagram of FIG. 7 and additionally includes the second control MOSFET 5 in series with the first control MOSFET 4. The third and fourth MOSFETs 20', 3' representing at least one conventional transistor cell of the transistor device are optional.

In the transistor device of FIGS. 12 and 13, not only the amount of charge that may flow to (or from) the field electrode region 31 within a predefined time period after the transistor device has been switched on, but also the overall amount of charge flowing between the field electrode 31 and the one of the source and gate terminals S, G can be controlled. Controlling the charge that flows from the field electrode 31 after the transistor device has been switched on, allows adjustment to the output capacitance and, consequently, the on-resistance of the transistor device. While in the embodiments explained previously, the field electrode 31 of the variable transistor cells 10 is either left floating (resulting in a low output capacitance but a high on-resistance) when the resistance of the variable resistor is very high, or is discharged (where the rate at which the compensation region 32 is discharged may vary), the field electrode 31 of the transistor device of FIGS. 12 and 13 can be partly discharged. Thus, it is possible to continuously vary the output capacitance and the on-resistance of the transistor device. The amount of charge that flows from the field electrode 31 after the transistor device has been switched on is controlled by the first and second control MOSFETs 4, 5.

The operating principle of the transistor device of FIGS. 12 and 13 is explained below. For explanation purposes, it is assumed that the transistor device is in the off-state, so that the field electrode 31 has been charged. When the transistor device is switched on by applying a suitable gate-source voltage $V_{GS}$, a control potential applied to the control terminal CC defines the resistance of the first control MOSFET 4 and, therefore, defines the amount of charge that may flow between the field electrode 31 and the source terminal S within a pre-defined time period. The second control MOSFET 5 defines the duration of the time period for which charge can be transferred between the field electrode 31 and the source terminal S. This second control MOSFET 5 is controlled through the gate terminal G and switches off, when the voltage between the gate terminal G and the source terminal S reaches the threshold voltage (pinch-off voltage) of the second control MOSFET 5. The threshold voltage of the second control MOSFET 5 is adjusted such that it is lower than the gate-source voltage $V_{GS}$ finally applied between the gate terminal G and the source terminal S when the transistor device is in the on-state. The gate-source voltage that is applied between the gate terminal G and the source terminal S in the on-state of the transistor device is, for example, between 5V and 20V, in particular between 7V and 15V. The threshold voltage of the second control MOSFET 5 is lower than this voltage.

When the transistor device switches on, the gate-source voltage $V_{GS}$ increases from an off-value to an on-value. The off-value is, for example, 0V in an n-type transistor device, and the on-value corresponds to the final value explained before. When the gate-source voltage $V_{GS}$ increases, the second control MOSFET 5 is switched on until the gate-source voltage reaches the threshold value of this second control MOSFET 5. In the time period before the second control MOSFET 5 pinches off, the field electrode 31 can be discharged, where the amount of charge that flows from the field electrode 31 to the source terminal S within a pre-defined time period is defined by the first control MOSFET 4. After the second control MOSFET 5 has been pinched off, the field electrode 31 is not discharged any further, independent of the control voltage applied between the control terminal CC and the source terminal S. Thus, the amount of charge that remains in the field electrode after the transistor device has been switched on, can be controlled through the first and second control MOSFETs 4,5 in this embodiment.

Figure 14:
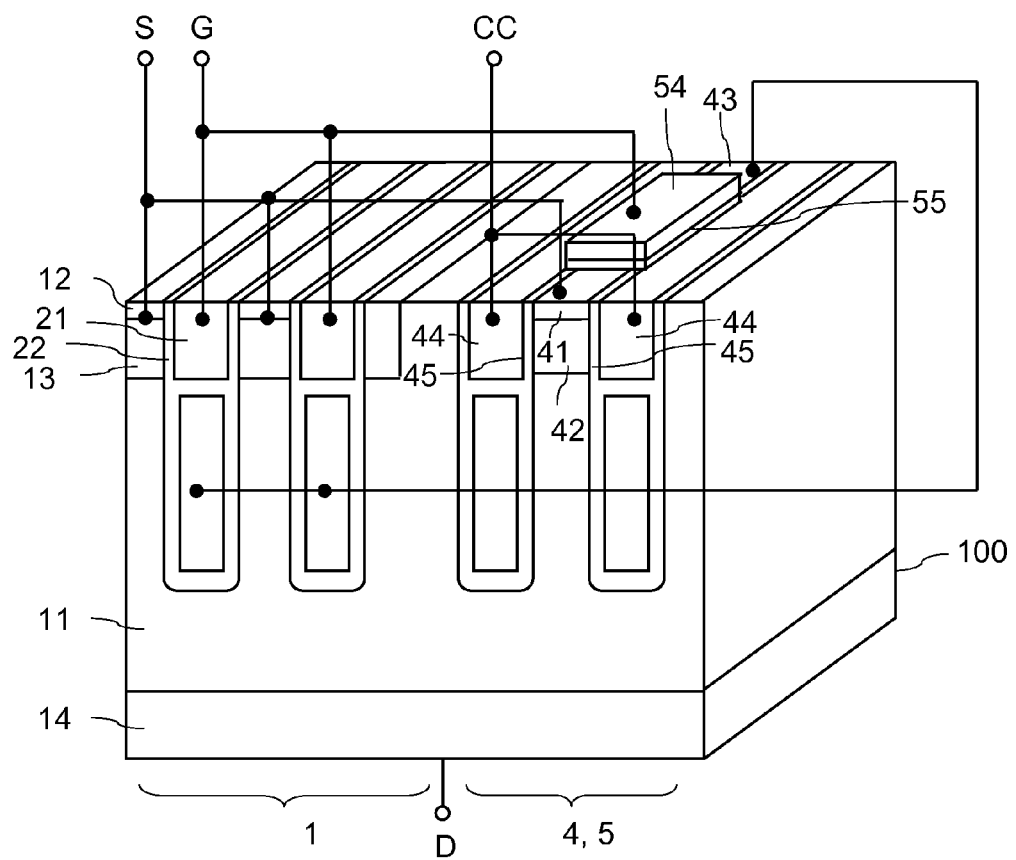
FIG. 14 shows a modification of the transistor device of FIG. 12.

FIG. 14 shows a modification of the transistor device of FIG. 11. In the transistor device of FIG. 13, the first and second control MOSFETs 4, 5 share the source region 41, the drain region 43 and the body region 42. In this embodiment, two gate electrodes are adjacent the body region 42, the source region 41 and the drain region 43, namely the at least one gate electrode 44 of the first control MOSFET 4, and the gate electrode 54 of the second control MOSFET 5. In the present embodiment, the at least one gate electrode 44 of the control MOSFET 4 is a trench electrode, like in the embodiment explained with reference to FIGS. 8, 10 and 12 herein before, and the gate electrode 54 of the switch is located above the first surface 101. However, it is, of course, possible to change the positions of the gate electrode 44 of the control MOSFET 4 and the gate electrode 54 of the switch.

Figure 15:
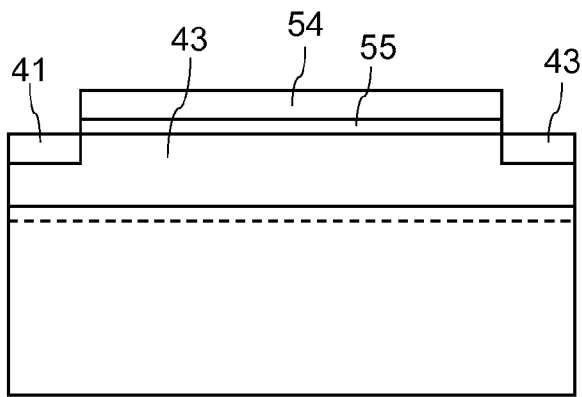
FIG. 15 shows a vertical cross sectional view of a lateral depletion MOSFET of FIG. 14.

FIG. 15 illustrates a vertical cross sectional view of the combined first and second control MOSFET 4, 5 of FIG. 14 in a section plane extending in the longitudinal direction of the body region 42 and cutting through the body region 42, the source and drain regions 41, 43, the gate electrode 54 and the gate dielectric 55.

Figure 16:
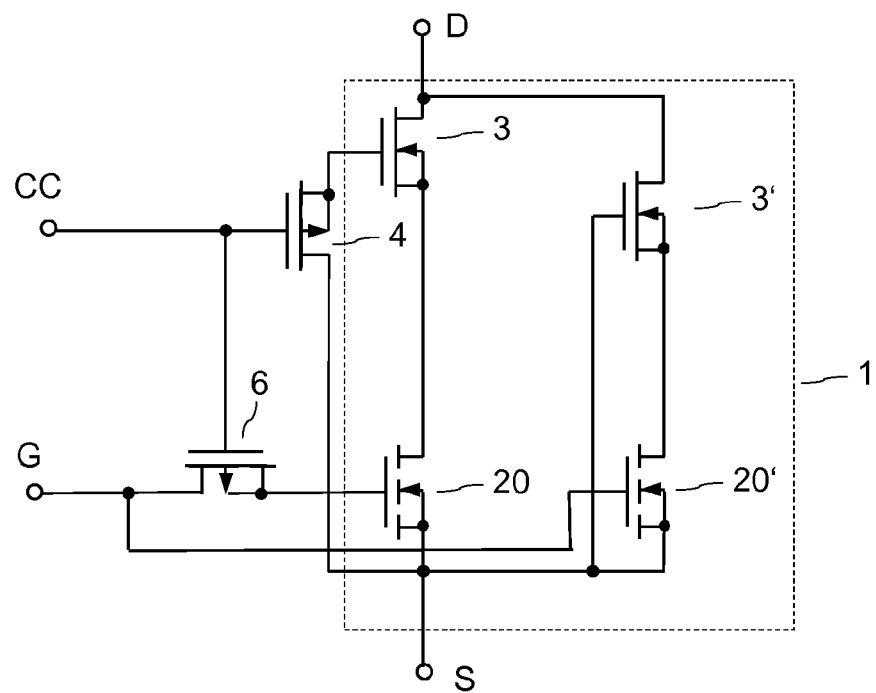
FIG. 16 illustrates the equivalent circuit diagram of a transistor device according to a further embodiment.

FIG. 16 shows the equivalent circuit diagram of a transistor device according to a further embodiment. This transistor device includes a further switch 6 connected between the gate terminal G and the gate electrodes 21 (not illustrated in FIG. 14) of the variable transistor cells 10 of the load MOSFET 1. These variable transistor cells 10 are represented by the first and second MOSFETs 20, 3 in the equivalent circuit diagram of FIG. 16, so that the further switch 6 is connected between the gate terminal G of the transistor device and the gate node of the first MOSFET 20 in the present embodiment. The transistor device further includes at least one conventional transistor cell 10' (not shown in FIG. 16) represented by the fourth and fifth MOSFETs 20', 3' in the equivalent circuit diagram of FIG. 16. The gate electrode of the at least one conventional transistor cell is directly connected to the gate terminal of the transistor device (represented by the gate node of the third MOSFET 20' being directly connected to the gate terminal G).

Referring to the previous explanation, capacitive losses that occur during operation of the transistor device result from charging and discharging the field electrode 31 and from a corresponding charging and discharging of the drift region 11 of the at least one transistor cell 10, and result from charging and discharging the gate electrode 21 (the gate-source capacitance) of the at least one transistor cell 10. In an operation scenario in which the resistance of the variable resistor 4 is adjusted such that the field electrode 31 is not discharged when the transistor device switches on, the transistor cell 10 is deactivated. That is, the transistor cell 10 does not conduct a current in the drift region 11. Since there is no charging and discharging of the field electrode 31 in this operation scenario, capacitive losses of the corresponding transistor cell 10 are significantly reduced. In a transistor device in which the variable resistor 4 is implemented as a depletion MOSFET, charging and discharging of the field electrode 31 can be prevented by adjusting the control potential (control signal) at the control terminal CC such that the depletion MOSFET 4 is switched off.

However, even in an operation scenario in which the field electrode 31 is not discharged when the transistor device switches on, there may still be capacitive losses resulting from charging and discharging of the gate-source capacitance. These capacitive losses resulting from charging and discharging the gate-source capacitance can be prevented in the transistor device of FIG. 16 in which the further switch 6 is connected between the gate terminal G and the gate electrode of the at least one transistor cell 10. Referring to FIG. 16, the further switch 6 can be implemented as a MOSFET, in particular as a depletion MOSFET that is controlled by the control potential at the control terminal CC and that has its load path (drain-source path) connected between the gate terminal G and the gate electrode of at least one transistor cell 10. According to one embodiment, the MOSFET forming the further switch 6 has the same conduction type as the control MOSFET 4. That is, the MOSFET forming the further switch 6 is a p-type depletion MOSFET when the control MOSFET 4 is a p-type depletion MOSFET. Thus, the further switch 6 switches off when the control MOSFET 4 switches off. In this case, not only charging and discharging of the field electrode 31, but also charging and discharging of the gate electrode of the at least one transistor cell 10 is prevented. In this operation scenario, only the conventional transistor cells (represented by MOS- FETs 20', 3' in FIG. 16) can be controlled (switched on and switched off) through the gate terminal G.

Figure 17:
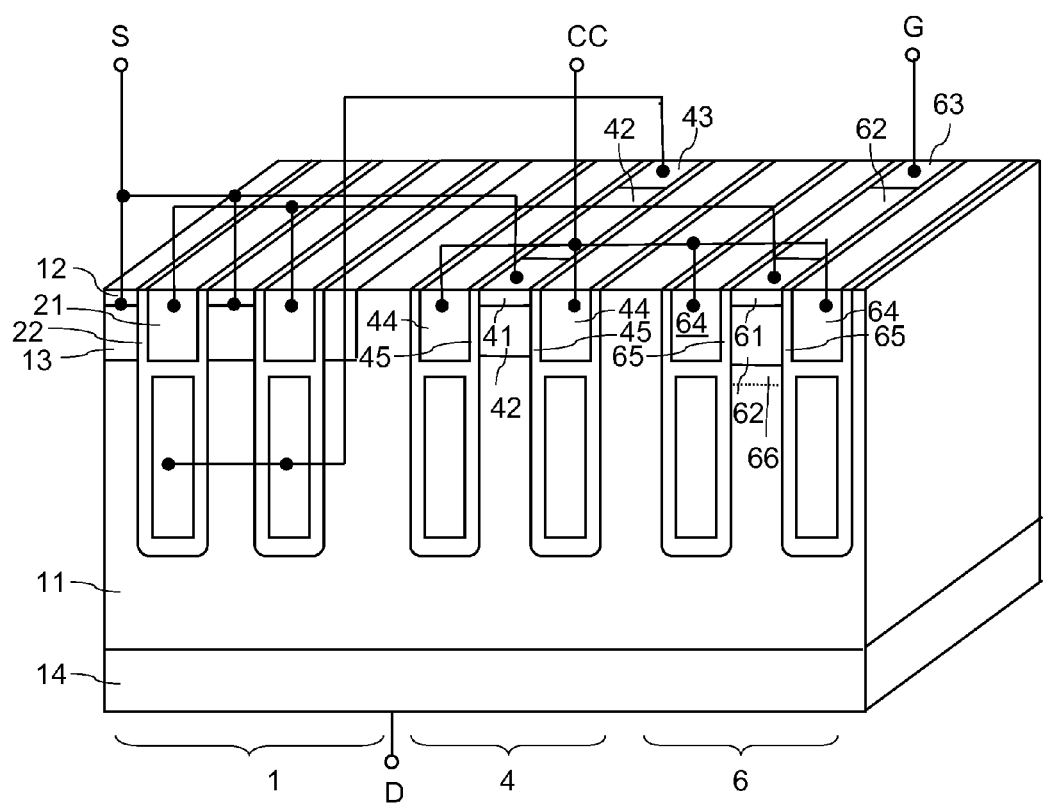
FIG. 17 illustrates one possible implementation of the transistor device of FIG. 16.

FIG. 17 shows a perspective sectional view of a semiconductor body 100 in which the load MOSFET 1, the control MOSFET 4 and the further switch 6 implemented as a depletion MOSFET are implemented. In this embodiment, the further switch 6 is implemented as a lateral MOSFET with a topology corresponding to the topology of the control MOSFET 4. That is, the further switch 6 includes a source region 61, a body region 62 and a drain region 63 of the same conduction type. According to one embodiment, the further switch is a p-type depletion MOSFET when the control MOSFET 4 is a depletion MOSFET, and the load MOSFET 1 is an n-type MOSFET. In this case, the source region 61, the body region 62 and the drain region 63 are p-doped, wherein the source region 61 and the drain region 63 have higher doping concentrations than the body region 62. In the present embodiment, a drain region 63 of the switch 6 is connected to the gate terminal G, the source region 61 is connected to the gate electrodes 21 of the transistor cells of the load MOSFET 1, and the at least one gate electrode 64, that is dielectrically insulated from the source, body and drain region 61-63 by a gate dielectric 65 is connected to the control terminal CC.

Optionally, a dielectric layer 66 is arranged between the body region 62 and the substrate (the drift region 11). This dielectric region 66 may prevent a parasitic current from the gate terminal G to the drain terminal D.

Figure 18:
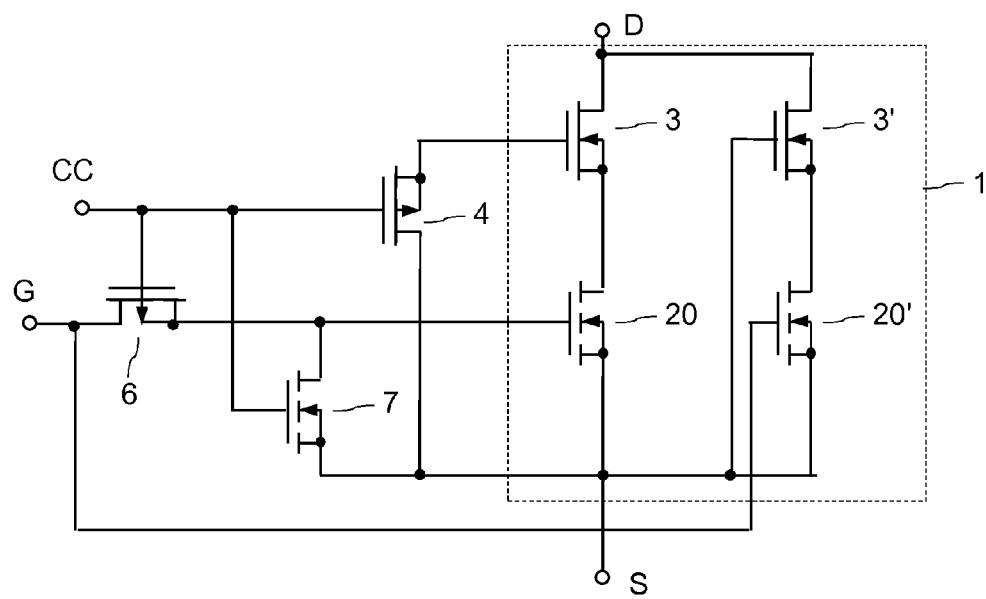
FIG. 18 illustrates the equivalent circuit diagram of a transistor device according to a further embodiment.

According to yet another embodiment, that is illustrated in FIG. 18 a second switch 7 is connected between the gate electrodes 21 of the transistor cells 10 of the load MOSFET 1 and the source terminal S (the further switch 6 will be referred to as first switch in connection with the embodiment of FIG. 18). Referring to FIG. 7, this second switch 7 can be implemented as an enhancement MOSFET of a conduction type complementary to the conduction type of the control MOSFET 4, and of the same conduction type as the transistor device. That is, the MOSFET forming the second switch 7 is an n-type MOSFET (as illustrated in FIG. 18) when the control MOSFET 4 is a p-type MOSFET, and the load MOSFET 1 is an n-type MOSFET.

Figure 19:
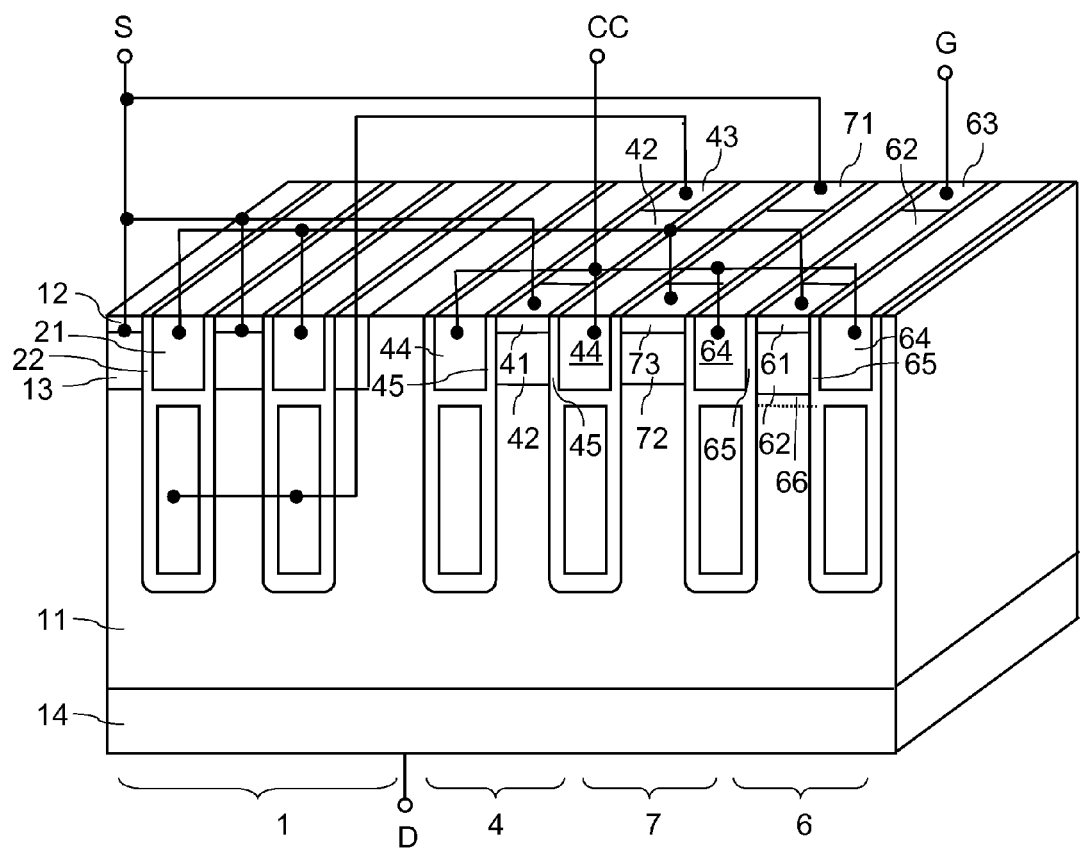
FIG. 19 illustrates one possible implementation of the transistor device of FIG. 18.

FIG. 19 shows a perspective sectional view of a semiconductor body 100 in which the load MOSFET 1, the control MOSFET 4, and the first and second switches 6, 7 are implemented. In this embodiment, the second switch 7, like the first switch 6, is implemented as a lateral MOSFET with a topology corresponding to the topology of the control MOSFET 4. That is, the MOSFET forming the second switch 7 includes a source region 71, and a drain region 73 of one conduction type (an n-type when the MOSFET 7 is an n-type MOSFET), and a body region 72 of the complementary conduction type (a p-type when the MOSFET 7 is an n-type MOSFET). The second switch MOSFET 7 and at least one of the control MOSFET 4 and the first switch MOSFET 6 share a gate electrode. In the present embodiment, the source region 71, the body region 72, and the drain region 73 of the second switch MOSFET 7 is located adjacent and between the at least one gate electrode 44 of the control MOSFET 4 and the at least one gate electrode 64 of the first switch MOSFET 6, wherein these gate electrodes 44, 64 are both connected to the control terminal CC.

The second switch MOSFET 7 is configured to conduct (is switched on) when the first switch MOSFET 6 blocks (is switched off). Thus, the second switch MOSFET 7 prevents the gate-source capacitance form being charged by parasitic effects when the first switch MOSFET 6 is switched off.

Figure 20:
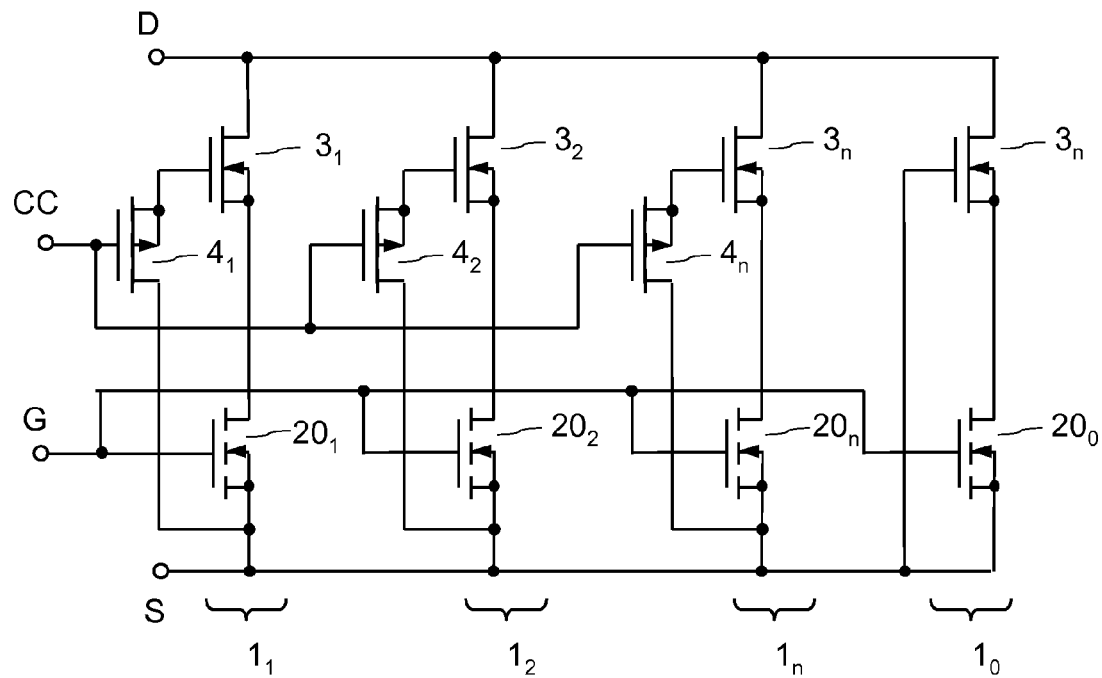
FIG. 20 illustrates the equivalent circuit diagram of a transistor device that includes a plurality of transistor cell groups.

FIG. 20 shows the equivalent circuit diagram of a transistor device according to a further embodiment. This transistor device includes a plurality of different groups of variable transistor cells. Each of these groups of transistor cells includes at least one variable transistor cell corresponding to the transistor cell 10 explained herein before. Each of these groups of variable transistor cells forms one of a plurality of load MOSFETs $1_1$, $1_2$, $1_n$ (each including a first MOSFET $20_1$-$20_n$ and a second MOSFET $3_1$-$3_n$ as explained before), wherein these load MOSFETs are connected in parallel between the drain and source terminals, and each of these load MOSFETs $1_1$, $1_2$, $1_n$ has its gate terminal connected to the gate terminal G of the transistor device. Further, the transistor device includes a plurality of control MOSFETs $4_1$-$4_n$, wherein each of the control MOSFETs $4_1$-$4_n$ is coupled to one of the load MOSFETs $1_1$-$1_n$ and is configured to control charging and discharging of the field electrode of the corresponding load MOSFET 1 in the way explained herein before. The individual control MOSFETs have their gate electrodes (gate terminals) connected to the control terminal CC.

Optionally, the transistor device includes at least one conventional transistor cell that is represented by the third and fourth MOSFET 20', 3' in the embodiment of FIG. 20. The individual load MOSFETs $1_1$-$1_n$ may additionally include a first switch 6, or a first switch 6 and a second switch 7, as explained with reference to FIGS. 16 to 10 herein before. However, these switches are not illustrated in FIG. 20.

The individual control MOSFETs $4_1$-$4_n$ may have different pinch-off voltages. Referring, for example, to FIG. 7 in which one control MOSFET 4 is shown, the pinch-off voltage of a control MOSFET 4 can be adjusted by suitably selecting a width of the body region 42 and/or a doping concentration of the body region 42. The width of the body region 42 is the dimension of the body region 42 in a direction perpendicular to the gate electrode 44. The pinch-off voltage decreases as the width decreases and increases as the width increases. Further, the pinch-off voltage decreases as the doping concentration decreases and the pinch-off voltage increases as the doping concentration increases.

In the transistor device of FIG. 20, the individual load MOSFETs $1_1$-$1_n$ can be activated and deactivated by suitably adjusting the control potential applied to the control terminal CC. According to one embodiment, the individual control MOSFET $4_1$-$4_n$ have different pinch-off voltages and the control potential applied to the control terminal CC can have n+1 different control levels. This is schematically illustrated in FIG. 21.

Figure 21:
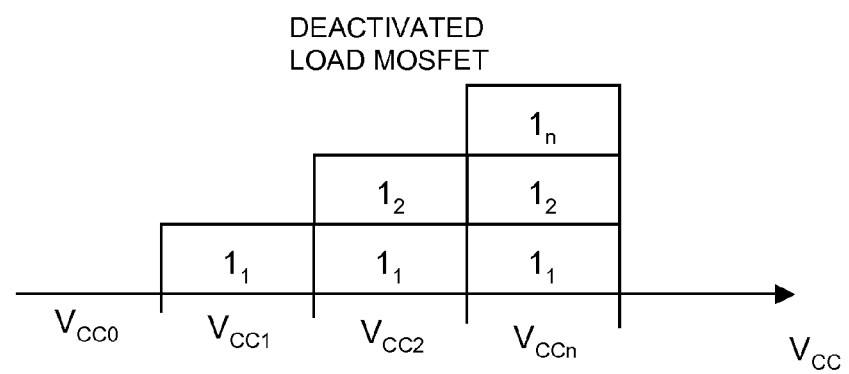
FIG. 21 illustrates the operating principle of the transistor device of FIG. 20.

FIG. 21 illustrates possible control levels of the control signal $V_{CC}$ applied to the control terminal CC, and illustrates the load MOSFETs that are deactivated at the corresponding level. In FIG. 21, $V_{CC0}$ represents a first signal level of the control potential $V_{CC}$. This signal level is selected such that none of the load MOSFETs $1_1$-$1_n$ is deactivated. At a second signal level $V_{CC1}$, the first load MOSFET $1_1$ is deactivated, at a second signal level $V_{CC2}$, the first and second load MOSFETs $1_1$, $1_2$ are deactivated, and at an n-th signal level $V_{CCn}$, each of the load MOSFETs $1_1$-$1_n$ is deactivated. At this control level $V_{CCn}$, only a load MOSFET $1_0$ formed by the conventional transistor cells (represented by the MOSFET 20' and 3' in FIG. 20) is activated. The transistor device of FIG. 20 includes n=3 load MOSFETs. However, this is only an example. Any other plurality of load MOSFETs can be implemented as well.

The transistor device of FIG. 20 can easily be modified by connecting a first switch between the gate terminal G and the gate electrodes of the transistor cells of each group and by connection an optional second switch between the gate electrodes of the transistor cells of each group and the source terminal S. This is schematically illustrated in FIG. 20 where a first load MOSFET $1_1$ represents a first group of first type transistor cells, and where a second load MOSFET $1_2$ represents a second group of first type transistor cells. The transistor device may include further groups of first type transistor cells and a group of second type transistor cells. However, these groups are not illustrated in FIG. 20. Referring to FIG. 20, each group of transistor cells has a first switch $6_1$, $6_2$ and a second switch $7_1$, $7_2$ associated thereto. The first switch $6_1$, $6_2$ is connected between the gate terminal G and the gate node of the first MOSFET $20_1$, $20_2$ of the corresponding group of transistor cells, and the second switch $7_1$, $7_2$ is connected between the gate node of the first MOSFET $20_1$, $20_2$ of the corresponding group of transistor cells and the source terminal S. The first switch $6_1$, $6_2$ of each group is adapted to the control MOSFET $4_1$, $4_2$ of the corresponding group such that the first switch $6_1$, $6_2$ is switched off when the corresponding control MOSFET $4_1$, $4_2$ is switched off. Accordingly, the second switch $7_1$, $7_2$ of each group is adapted to the first switch $6_1$, $6_2$ of the corresponding group such that the second switch $7_1$, $7_2$ is switched on when the corresponding first switch $6_1$, $6_2$ is switched off.

The transistor device explained herein before includes a load MOSFET with at least one first type transistor cell 10, and a control MOSFET 4 coupled to the field electrode of the at least one transistor cell. The load MOSFET 1 may include a plurality, such as several 100, several 1000 ($10^3$), several 10000 ($10^4$), or several 100000 ($10^5$) transistor cells 10. The control MOSFET 4 is connected to the field electrodes of a plurality of these transistor cells.

The control MOSFET 4 is not restricted to be used in connection with transistor cells comprising a field electrode, such as field electrode 31 explained before, but may also used in connection with transistor cells having another type of depletion control region, such as a compensation region 33 of a conduction type complementary to the conduction type of the drift region 11.

Figure 23:
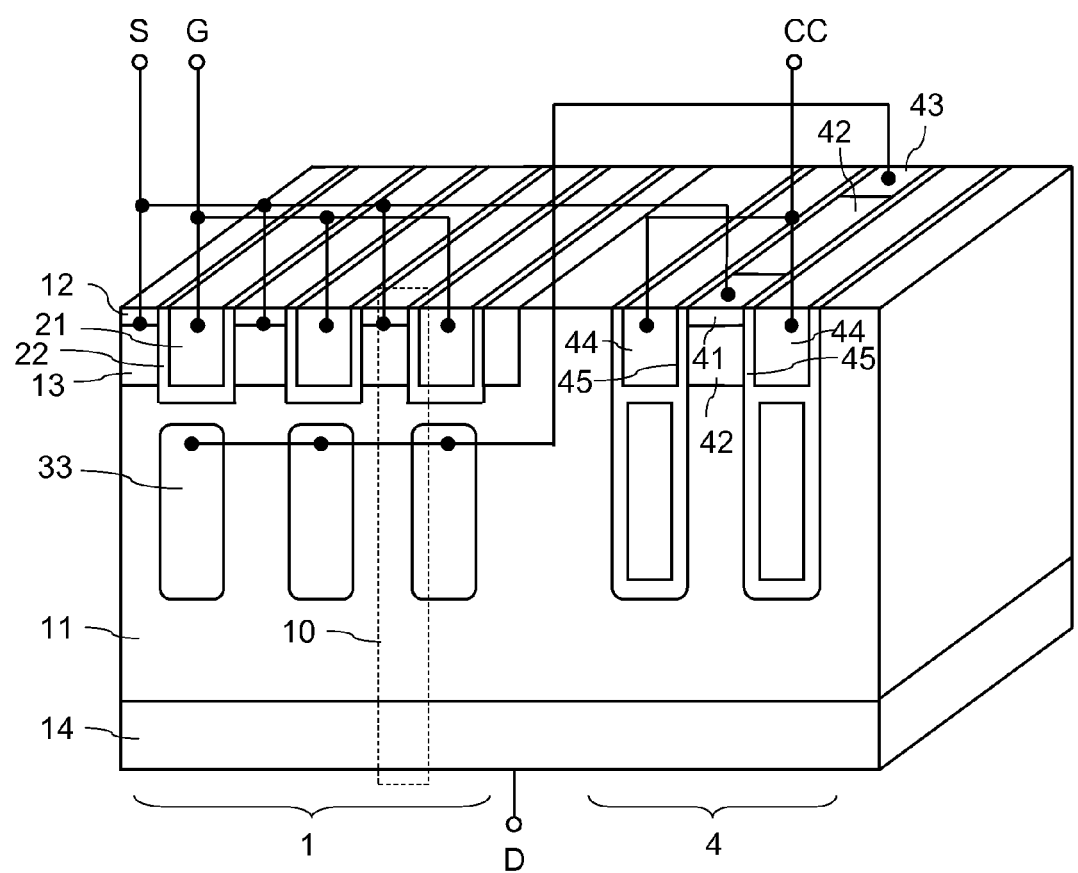
FIG. 23 illustrates a transistor device including a plurality of vertical transistor cells each including a compensation region, and a variable resistor implemented as a lateral depletion MOSFET.

FIG. 23 shows a perspective sectional view of a semiconductor body 100 in which a plurality of transistor cells 10 each having a compensation region 33 are integrated. The embodiment of FIG. 23 is based on the embodiment of FIG. 8 and is different from the embodiment of FIG. 8 in that the compensation regions 33 instead of the field electrodes 31 are coupled to one of the source and gate terminals S, G through the control MOSFET 4. The operating principle of the transistor cells 10 with the compensation region 33 is similar to the operating principle of the transistor cells 10 with the field electrode 31 and the field electrode dielectric 32. That is, the compensation region 33, like the field electrode 31, in the off-state of the transistor device, provides counter-charges for ionized opened atoms in the drift region 11.

Figure 22:
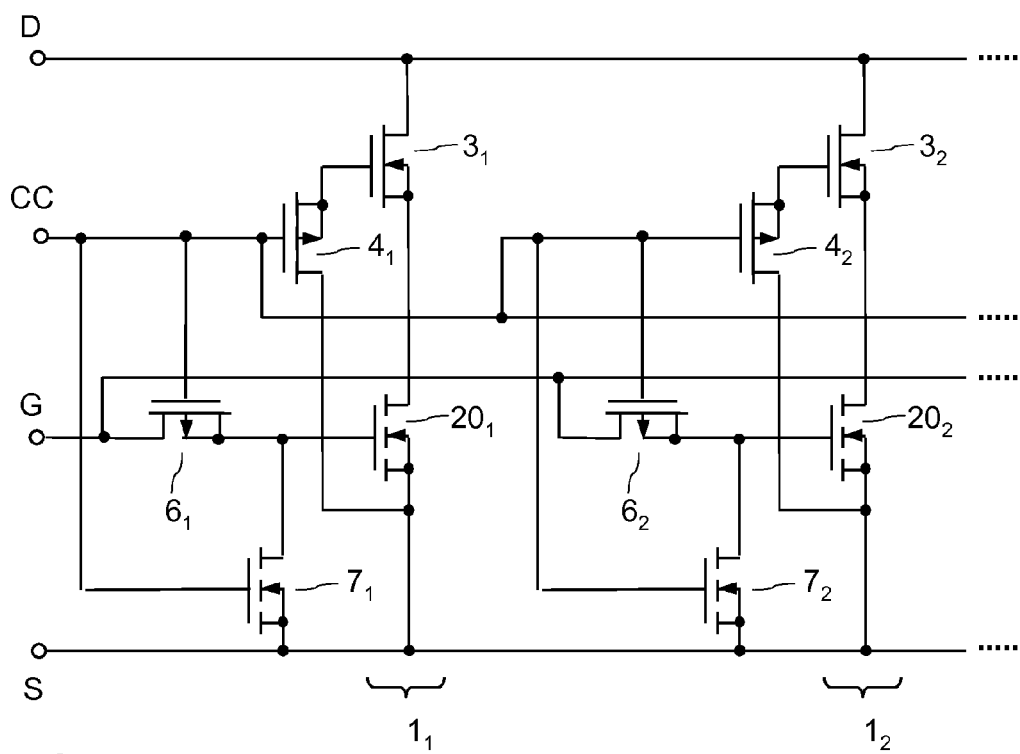
FIG. 22 illustrates the equivalent circuit diagram of a transistor device that is a modification of the transistor device of FIG. 20.
Figure 24:
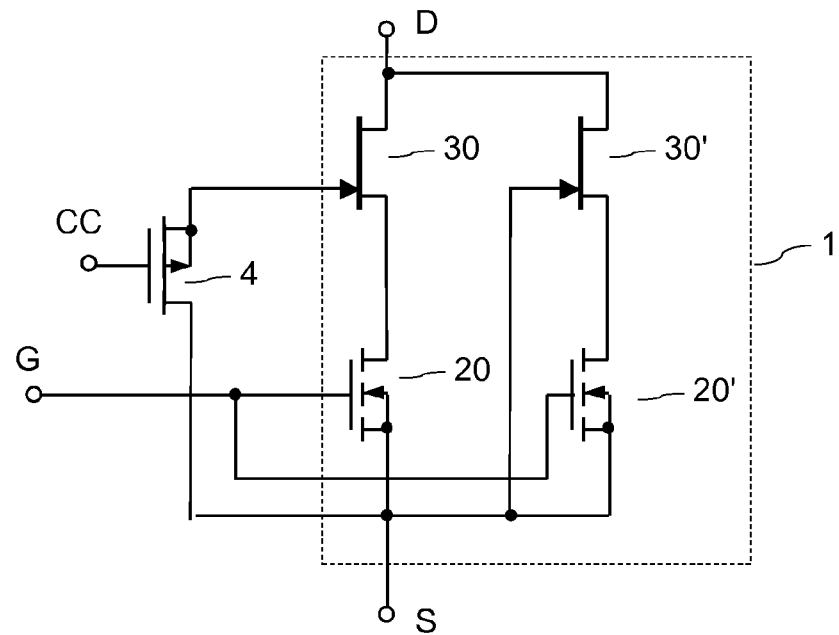
FIG. 24 shows the equivalent circuit diagram of the transistor device of FIG. 23.

The equivalent circuit diagram of the semiconductor device of FIG. 23 is illustrated in FIG. 24. This equivalent circuit diagram is based on the circuit diagram of FIG. 7, wherein the depletion MOSFETs 3, 3' of FIG. 7 are replaced by JFETs 30, 30' in FIG. 23. JFET 30 represents the compensation region 33 and those sections of the drift region 11 adjoining the compensation region 31. Like the transistor devices explained herein before, the transistor device in FIG. 22 may additionally include conventional transistor cells. Conventional transistor cells are transistor cells that have a compensation region (33 in FIG. 22) permanently connected to one of the gate and source terminal S, G. MOSFET 20' and JFET 30' in FIG. 23 represent the optional conventional transistor cells.

The transistor device of FIG. 24 that includes transistor cells with compensation regions as depletion control regions instead of field electrodes can be modified in the same way as the transistor device explained with reference to FIG. 7. According to one embodiment, the transistor device additionally includes the first switch 6 and the optional second switch. This is explained with reference to FIG. 25 below.

Figure 25:
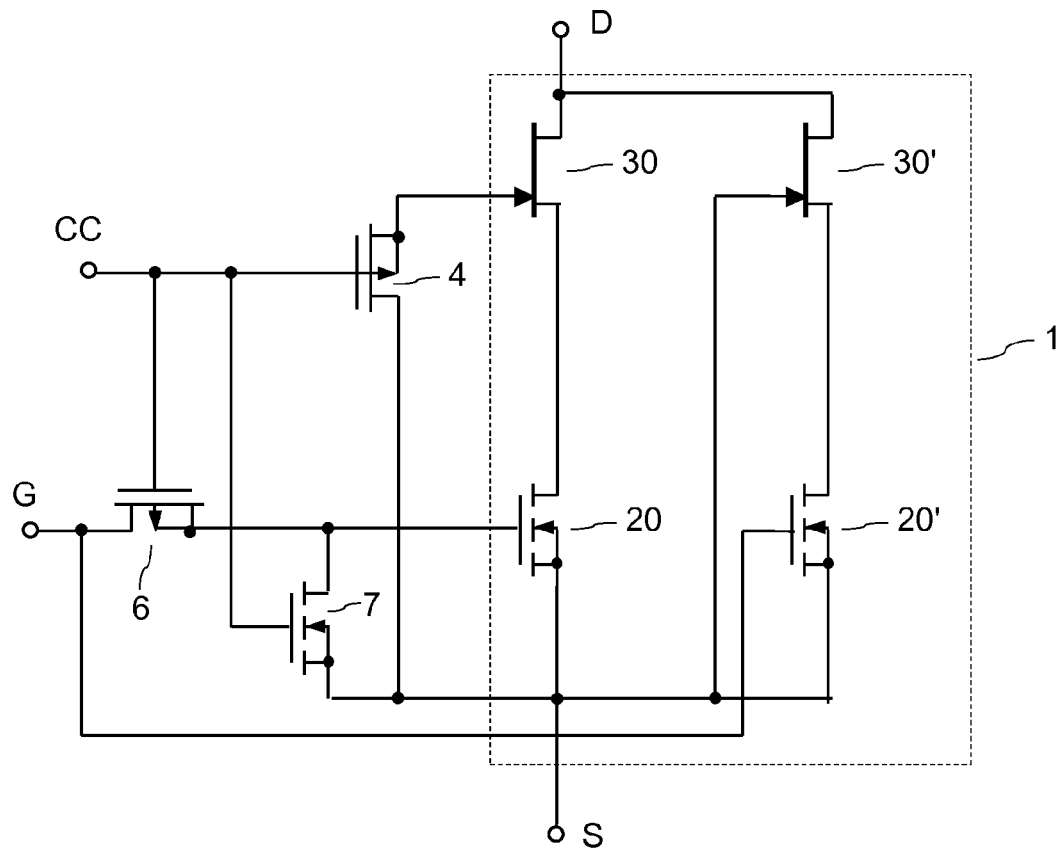
FIG. 25 shows the equivalent circuit diagram of a modification of the transistor device of FIG. 24.

FIG. 25 shows the equivalent circuit diagram of a transistor device that is based on the transistor devices of FIGS. 23 and 24. The transistor device of FIG. 25 includes the first switch 6 and, optionally, the second switch 7 explained with reference two FIGS. 16 and 18 herein before. The operating principle of the transistor device of FIG. 25 corresponds to the operating principle of the transistor device of FIG. 18. The difference between the transistor device of FIG. 25 and the transistor device of FIG. 18 is that the transistor cells of the MOSFET 1 include compensation regions (33 in FIG. 22) instead of field electronic 31.

Figure 26:
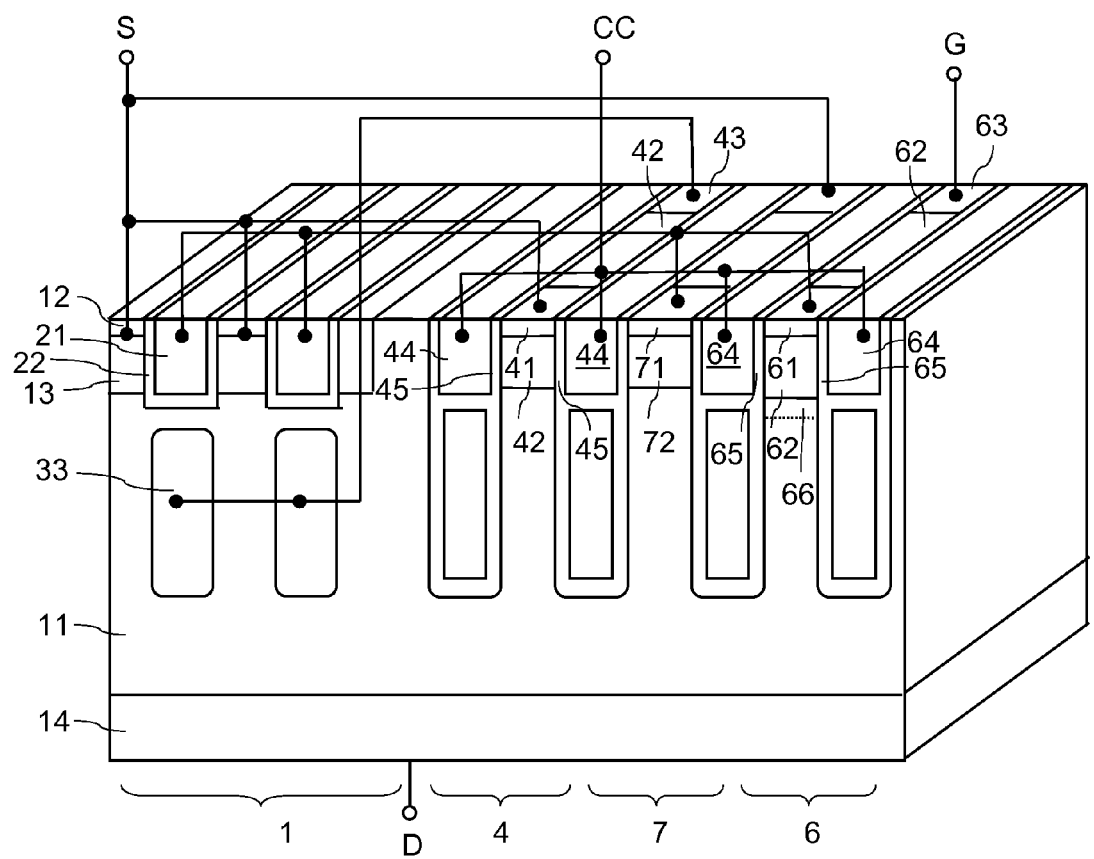
FIG. 26 illustrates a first possible implementation of the transistor device of FIG. 25.

FIG. 26 shows a perspective sectional view of a semiconductor body 100 in which the transistor device of FIG. 25 is implemented. The transistor device of FIG. 26 is based on the transistor device of FIG. 19 and is different from the transistor device of FIG. 19 in that the field electrodes 31 and the corresponding field electrode dielectrics 32 are replaced by the compensation regions 33.

Figure 27:
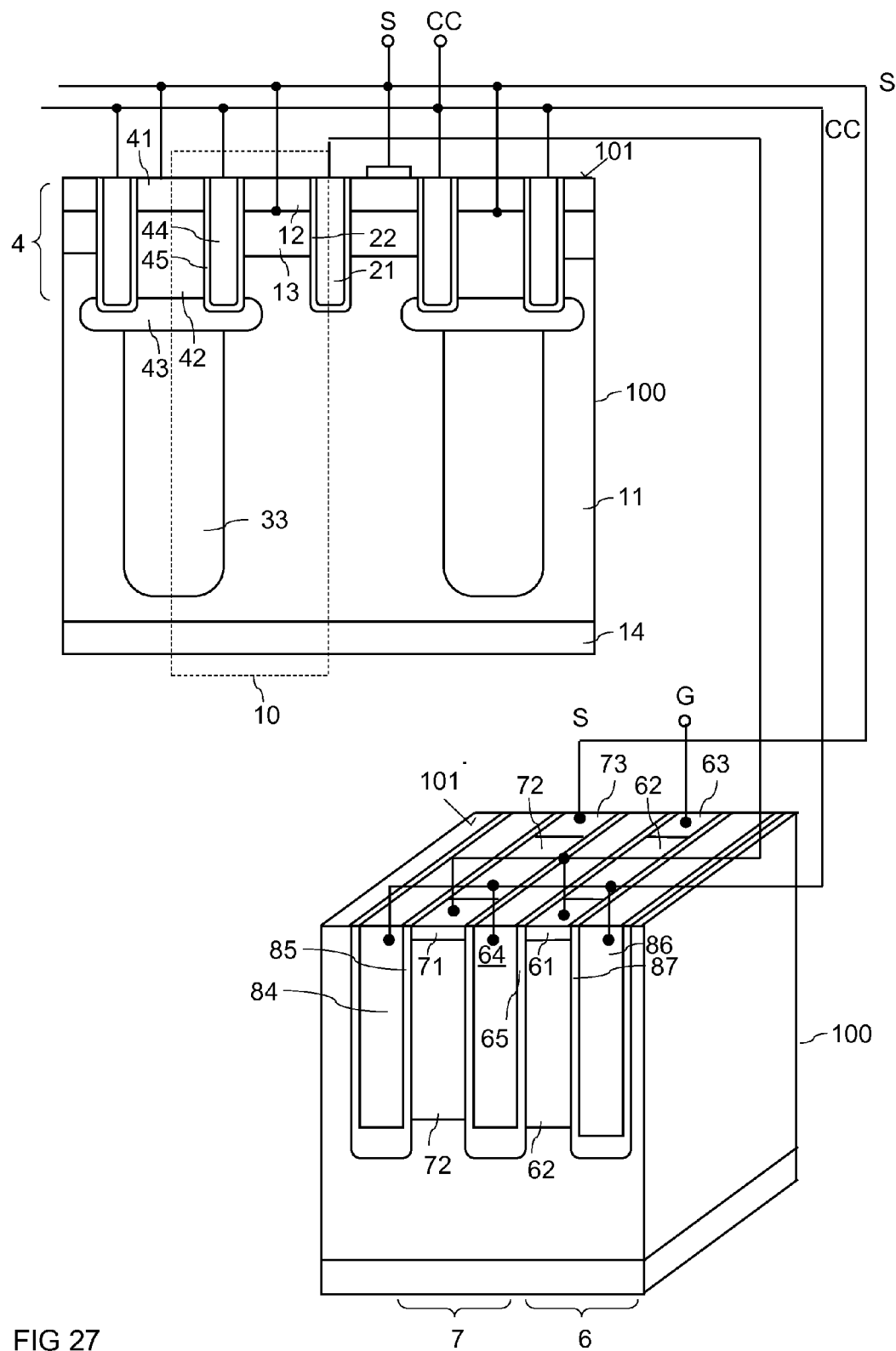
FIG. 27 illustrates a second possible implementation of the transistor device of FIG. 25.

FIG. 27 shows a further way of implementing the transistor device of FIG. 25. FIG. 27 shows a vertical cross sectional view of a first section of the semiconductor body and a perspective sectional view of a second section of the semiconductor body 100. In the first section of the semiconductor body 100, a plurality of first type transistors cells 10 is implemented. Like in the embodiments explained herein before, each transistor cell 10 is implemented as a vertical transistor and includes a drift region 11, a source region 12, a body region 13 arranged between the drift region 11 and the source region 12, and a gate electrode 21 adjacent the body region 13 and dielectrically insulated from the body region 13 by a gate dielectric 22. Like in the embodiments explained before, the gate electrode 21 is a trench electrode that is arranged in a trench extending from the first surface 101 into the semiconductor body 100.

Referring to FIG. 27, the control MOSFET 4 includes a plurality of transistor cells, wherein each transistor cell of the control MOSFET 4 is arranged between one compensation region 33 and the first surface 101 of the semiconductor body 100. Each transistor cell of the control MOSFET 4 includes a source region 41 coupled to one of the source terminal S (as illustrated) and the gate terminal G (as not illustrated), a drain region 43 adjoining the compensation region 33, and a body region 42 between the source region 41 and the drain region 43, and a gate electrode 44 adjacent the body region 42 and dielectrically insulated from the body region 42 by a gate dielectric 45. The drain region 43 can be a separate region having a higher doping concentration than the compensation region 33 as illustrated), or can be formed by a section of the compensation region 33. The gate electrode 44 of the transistor cell of the control MOSFET 4 is trench electrode in the present embodiment. The individual transistor cells of the control MOSFET are connected in parallel.

Referring to FIG. 27, the first switch 6 and the optional second switch 7 are each implemented as lateral depletion MOSFETs in the way explained with reference to FIG. 19 herein before. The first switch MOSFET 6 and the second switch MOSFET 7 share one gate electrode 64, namely the gate electrode between the body region 62 of the first switch MOSFET 6 and the body region 72 of the second switch MOSFET 7. Further gate electrodes 84, 86 dielectrically insulated from the body regions 62, 72, respectively, by dielectric layers 85, 87 and located opposite the gate electrode 64 are optional.

Figure 28:
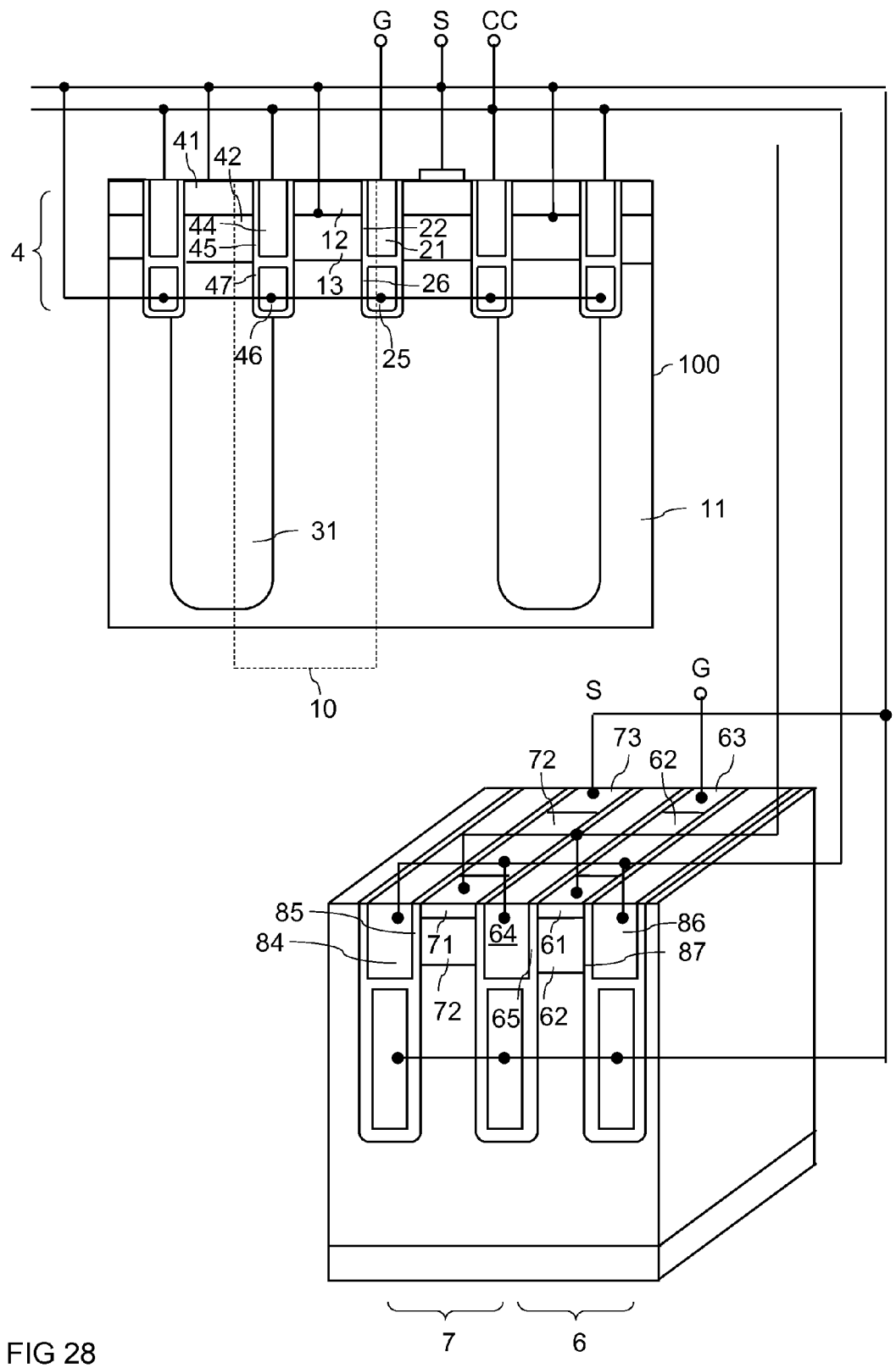
FIG. 28 illustrates a third possible implementation of the transistor device of FIG. 25.

FIG. 28 shows a modification of the transistor device of FIG. 27. In the transistor device of FIG. 28, each first type transistor cell 10 includes a field electrode 25 adjacent the drift region 11, dielectrically insulated from the drift region 11, and coupled to the source terminal S. Equivalently, field electrodes can be located below the gate electrode(s) 64 (84, 86) of the lateral switch MOSFETs 6, 7. These field electrodes are also coupled to the source terminal S.

Figure 29:
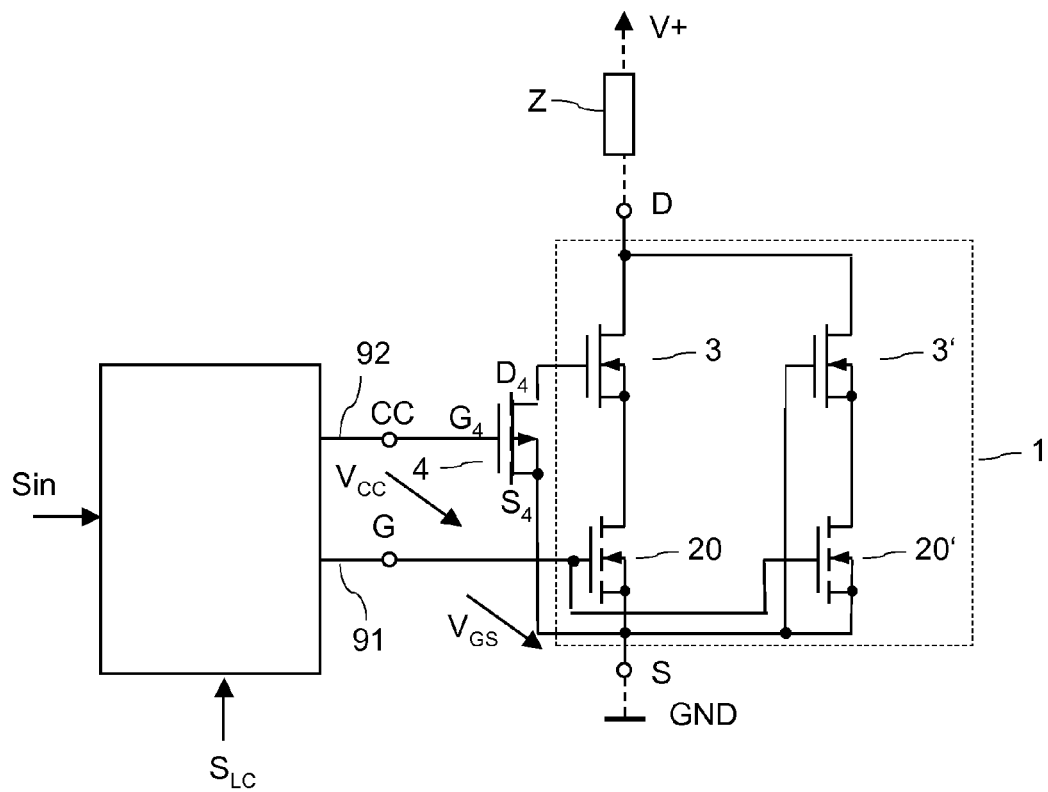
FIG. 29 illustrates a first embodiment of an electronic circuit including a transistor device and a drive circuit.

FIG. 29 shows a circuit arrangement with a transistor device as previously explained, and with a drive circuit 9 configured to drive the transistor device. In the circuit of FIG. 29, the transistor device is represented by the equivalent circuit diagram explained with reference to FIG. 7. However, each of the modifications of the transistor device explained herein before may be used as well.

Referring to FIG. 29, the drive circuit 9 includes a first output 91 coupled to the gate terminal G of the transistor device, and a second output 92 coupled to the control terminal CC of the transistor device. According to one embodiment, the drive circuit 9 is configured to switch on and switch off the transistor device dependent on an input signal Sin indicating a desired switching state of the transistor device. The drive circuit 9 generates the gate-source voltage (drive voltage) $V_{GS}$ dependent on the input signal Sin. The drive circuit 9 is further configured to generate the control signal $V_{CC}$ applied to the control terminal. Depending on the particular implementation, the control signal $V_{CC}$ may define the rate at which the field electrode 31 is discharged when the transistor device switches on, or may serve to activate or deactivate first type transistor cells. According to one embodiment, the drive circuit 9 generates the control signal dependent on a load condition signal $S_{LC}$ received by the drive circuit 9. The load condition signal $S_{LC}$ represents a load condition of the transistor device. According to one embodiment, the load condition signal represents a load current through the transistor device in the on-state. The load current of the transistor device is the current between the drain and source terminals D, S in the on-state. According to a further embodiment, the drive circuit is configured to cyclically switch on and switch off the transistor device at a predefined switching frequency. In this case, the switching frequency defines a load condition of the transistor device.

When the transistor device is in operation, ohmic losses and capacitive losses occur. Ohmic losses are those losses resulting from a current flowing between the drain and source terminals D, S of the transistor device when the transistor device is in the on-state. These losses are mainly dependent on the on-resistance. Capacitive losses result from charging and discharging parasitic capacitances in the transistor device. A first parasitic capacitance is the gate-source capacitance (often referred to as $C_{GS}$). The gate-source capacitance is formed by the gate electrode 21, the gate dielectric 22 and the source region 12. This gate capacitance is charged when the transistor device switches on, and is discharged when the transistor device switches off. A further parasitic capacitance is the capacitance formed by the field electrode 31, the field electrode dielectric 32 and the drain region 11. This capacitance can be considered as the gate-source capacitance of the depletion MOSFET 3. This capacitance is part of the drain-source capacitance (often referred to as $C_{DS}$) of the transistor device, wherein the drain-source capacitance is part of the output capacitance of the transistor device (the output capacitance, that is often referred to as $C_{OSS}$, is the drain-source capacitance $C_{DS}$ plus the gate-drain capacitance $C_{GD}$, wherein the gate-drain capacitance is the capacitance between the gate electrode 21 and the drift region 11).

In those transistor devices explained before that either have the first switch 5 that limits discharging of the field electrode 31, and/or that include at least one second type (conventional) transistor cell, the output capacitance and the on-resistance can be adjusted. There is a tradeoff between the on-resistance and the output capacitance in that that the output capacitance decreases as the on-resistance increases, and vice versa. In a transistor device that includes the first switch 5, the output capacitance can be decreased by allowing the field electrode 31 only to partly discharge when the transistor device switches on. However, this increases the on-resistance because the drift region 11 is partly depleted.

In a transistor device that includes transistor cells of the first type and the second type, the output capacitance can be decreased (and the on-resistance can be increased) by deactivating the transistor cells of the first type.

According to one embodiment, the drive circuit 9 adjusts a first output capacitance (and a first on-resistance) when the load current is higher than a predefined current level, and adjusts a second output capacitance lower than the first output capacitance (and a second on-resistance higher than the first on-resistance) when the load current is lower than the predefined current level. In this case, the on-resistance decreases (and the conduction losses decrease) as the load current increases.

According to a further embodiment, the drive circuit adjusts the first output capacitance (and the first on-resistance) when the switching frequency is lower than a predefined frequency level, and adjusts a second output capacitance lower than the first output capacitance (and a second on-resistance higher than the first on-resistance) when the switching frequency is higher than the predefined frequency level. In this case, the output capacitance decreases (and the capacitive losses decrease) as the frequency increases.

In the embodiments explained before, the variable resistor 4, the first switch 5, the second switch 6, and the third switch 7 can be integrated in the same semiconductor body 100 as the at least one first type transistor cell. However, this is only example. It is also possible to implement the variable resistor 4 and the switches 5-7 in one semiconductor body (integrated circuit), and to implement the at least one transistor cell in another semiconductor body.

According to one embodiment, the functionality of the variable resistor 4, at least of the second switch 6, and optionally of the first switch 5 and the third switch 7 is integrated in the drive circuit. In this embodiment that is illustrated in FIG. 30, the drive circuit 9 controls charging and discharging of the field electrode 31, controls driving the at least one first type transistor cell (represented by MOSFETs 20 and 3 in FIG. 30), and independent of driving the at least one first type transistor cell controls driving the at least one second type transistor cell (represented by MOSFETs 20 and 3 in FIG. 30).

Figure 30:
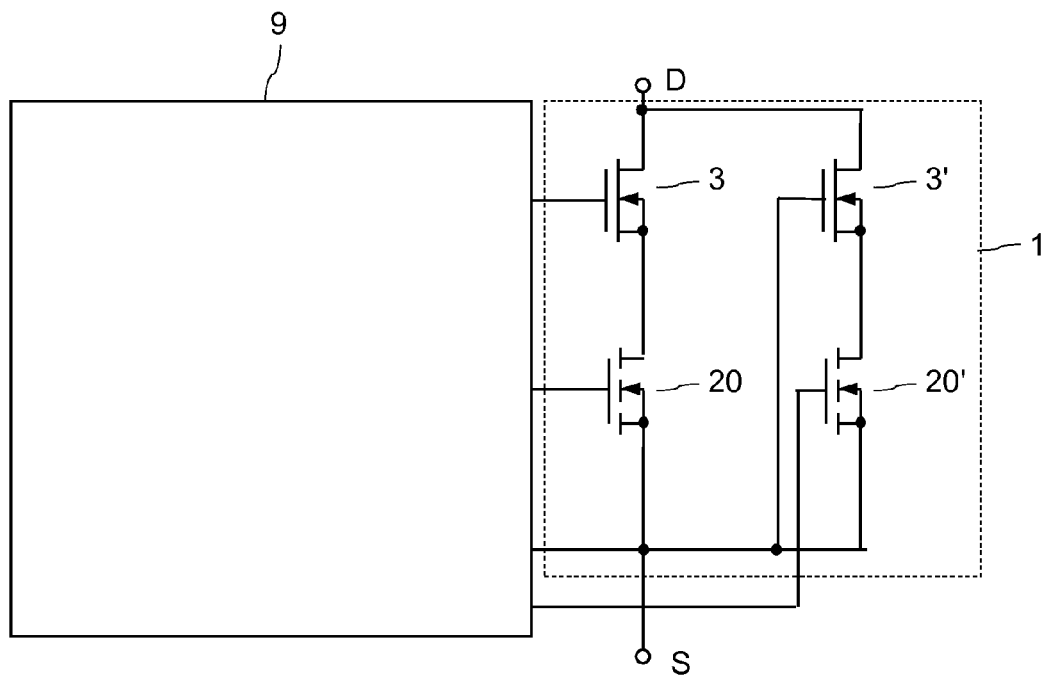
FIG. 30 illustrates a first embodiment of an electronic circuit including a transistor device and a drive circuit.

In the embodiment of FIG. 30, the drive circuit 9 controls operation of the at least one variable transistor cell (represented by transistors 20, 3 in FIG. 30) and operation of the at least one conventional transistor cell (represented by transistors 20', 3') in FIG. 30 independently. That is, the drive circuit may switch on and switch off these transistor cells independent of each other. Of course, a plurality of variable transistor cell may be connected in parallel (represented by transistors 20, 3 in FIG. 30) and driven by the drive circuit 9, and a plurality of conventional transistor cells may be connected in parallel (represented by transistors 20', 3' in FIG. 30) and driven by the drive circuit 9. Further, the drive circuit 9 is configured to control charging and discharging of the field electrode of the at least one variable transistor cell. This field electrode is represented by depletion MOSFET 3 in FIG. 30.

According to a further embodiment, which is a modification of the embodiment of FIG. 20, there are several groups of variable transistor cells, wherein the drive circuit 9 controls the individual groups independently. That is, in this modification of the embodiment of FIG. 20, the drive circuit 9 controls the transistors $20_1$-$20_n$ each representing one group of variable transistor cells independently, and controls the depletion MOSFETs $3_1$-$3_n$ each representing one field electrode independently. Further the drive circuit 9 is configured to control the transistor $20_0$ representing at least one conventional transistor cell independent of the other transistors $20_1$-$20_n$. According to one embodiment, the drive circuit 9 is configured to detect a load condition of the transistor device, and is configured to deactivate groups of transistor cells dependent on the load condition. According to one embodiment, the drive circuit 9 varies the number of groups that are deactivated dependent on the load condition. The load condition is, for example, represented by a load current through the transistor device, or by a desired switching frequency of the transistor.

In the description hereinbefore, directional terminology, such as "top," "bottom," "front," "back," "leading," "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

It is to be understood that the features of the various embodiments described herein may be combined with each other, unless specifically noted otherwise.

The invention claimed is:

1. An electronic circuit, comprising:
   a drive circuit; and
   a transistor device comprising:
      at least one first type transistor cell comprising a drift region, a source region, a body region arranged between the source region and the drift region, a drain region, a gate electrode adjacent to the body region and dielectrically insulated from the body region by a gate dielectric, and a field electrode adjacent to the drift region and dielectrically insulated from the drift region by a field electrode dielectric;
      a gate terminal coupled to the gate electrode of the at least one first type transistor cell, a source terminal coupled to the source region of the at least one first type transistor cell, and a control terminal configured to receive a control signal;
      a variable resistor connected between the field electrode of the at least one first type transistor cell and one of the gate terminal and the source terminal, wherein the variable resistor comprises a variable resistance that is configured to be adjusted through the control signal received at the control terminal; and
      a first switch connected in series with the variable resistor, such that the variable resistor and the first switch are connected in series between the field electrode and the one of the gate terminal and the source terminal, wherein the first switch is configured to be driven dependent on a drive signal received at the gate terminal of the transistor device,
   wherein the drive circuit is coupled to the gate terminal and the control terminal of the transistor device and is configured to generate the control signal so as to adjust the variable resistance of the variable resistor, based on a load condition of the transistor device, so that the variable resistance is dependent on the load condition.

2. The electronic circuit of claim 1, wherein the variable resistor comprises a MOSFET.

3. The electronic circuit of claim 2, wherein the MOSFET comprises a source region, a drain region, a body region between the source region and the drain region, and a gate electrode adjacent the body region, and dielectrically insulated from the body region by a gate dielectric.

4. The electronic circuit of claim 3, wherein the MOSFET is a depletion MOSFET of a conduction type complementary to a conduction type of the source region of the at least one first type transistor cell.

5. The electronic circuit of claim 3, wherein the at least one first type transistor cell and the MOSFET are integrated in a common semiconductor body.

6. The electronic circuit of claim 5,
wherein the source region and the drain region of the at least one first type transistor cell are distant in a vertical direction of the semiconductor body; and
wherein the source region and the drain region of the MOSFET are distant in a lateral direction of the semiconductor body.

7. The electronic circuit of claim 6, wherein the gate electrode of the at least one first type transistor cell and the gate electrode of the MOSFET have identical topologies.

8. The electronic circuit of claim 1, comprising a plurality of first type transistor cells, wherein the variable resistor is connected between the field electrode of each of the plurality of first type transistor cells and the one of the source terminal and the gate terminal.

9. The electronic circuit of claim 1, further comprising:
at least one second type transistor cell comprising a field electrode directly coupled to one of the gate terminal and the source terminal.

10. The electronic circuit of claim 1, further comprising:
a first controllable switch connected between the gate terminal and the gate electrode of the at least one first type transistor cell and configured to be driven dependent on the control signal.

11. The electronic circuit of claim 10, further comprising:
a second controllable switch connected between the gate electrode of the at least one first type transistor cell and the source terminal and configured to be driven dependent on the control signal.

12. The electronic circuit of claim 1, further comprising:
a plurality of transistor cell groups, each transistor cell group comprising at least one first type transistor cell, and
a plurality of variable resistors, wherein each of the plurality of variable resistors is connected between the field electrode of the at least one first type transistor cell of one transistor cell group and the one of the gate terminal and the source terminal, and
wherein each of the plurality of variable resistors comprises a depletion MOSFET configured to be driven by the control signal and wherein the depletion MOSFETs have mutually different pinch-off voltages.

13. The electronic circuit of claim 1, wherein the load condition is represented by a current through the transistor device.

14. The electronic circuit of claim 1, wherein the drive circuit is configured to cyclically switch on and off the transistor device at a switching frequency, and wherein the load condition is represented by the switching frequency.

15. An electronic circuit, comprising:
a drive circuit; and
a transistor device comprising:
at least one first type transistor cell comprising a drift region of a first conduction type, a source region, a body region arranged between the source region and the drift region, a drain region, a gate electrode adjacent the body region and dielectrically insulated from the body region by a gate dielectric, and a depletion control region adjacent the drift region, wherein the depletion control region is a doped semiconductor region of a second conduction type, the second conduction type being complementary to the first conduction type;
a gate terminal coupled to the gate electrode of the at least one first type transistor cell, a source terminal coupled to the source region of the at least one first type transistor cell, and a control terminal configured to receive a control signal;
a variable resistor connected between the depletion control region of the at least one first type transistor cell and one of the gate terminal and the source terminal, wherein the variable resistor comprises a variable resistance that is configured to be adjusted through the control signal received at the control terminal; and
a first controllable switch connected between the gate terminal and the gate electrode of the at least one first type transistor cell and configured to be driven dependent on the control signal,
wherein the drive circuit is coupled to the gate terminal and the control terminal of the transistor device and is configured to generate the control signal so as to adjust the variable resistance of the variable resistor, based on a load condition of the transistor device, so that the variable resistance is dependent on the load condition.

16. The electronic circuit of claim 15, further comprising:
a second controllable switch connected between the gate electrode of the at least one first type transistor cell and the source terminal and configured to be driven dependent on the control signal.

17. The electronic circuit of claim 15, further comprising:
at least one second type transistor cell comprising a depletion control region directly coupled to one of the gate terminal and the source terminal.

18. The electronic circuit of claim 15, wherein the load condition is represented by a current through the transistor device.

19. The electronic circuit of claim 15, wherein the drive circuit is configured to cyclically switch on and off the transistor device at a switching frequency, and wherein the load condition is represented by the switching frequency.

20. The electronic circuit of claim 15, wherein the depletion control region adjoins the drift region.

* * * * *